(12) United States Patent
Kabeshita et al.

(10) Patent No.: US 8,001,678 B2
(45) Date of Patent: Aug. 23, 2011

(54) COMPONENT MOUNTING APPARATUS

(75) Inventors: Akira Kabeshita, Hirakata (JP); Kurayasu Hamasaki, Neyagawa (JP); Noriyuki Tani, Kurume (JP); Shozo Minamitani, Ibaraki (JP); Yoichi Makino, Kurume (JP)

(73) Assignee: Panasonic Corporation, Osaka (JP)

( * ) Notice: Subject to any disclaimer, the term of this patent is extended or adjusted under 35 U.S.C. 154(b) by 428 days.

(21) Appl. No.: 12/202,594

(22) Filed: Sep. 2, 2008

(65) Prior Publication Data
US 2009/0007420 A1 Jan. 8, 2009

Related U.S. Application Data

(62) Division of application No. 10/564,275, filed on Jan. 11, 2006, now Pat. No. 7,437,818.

(30) Foreign Application Priority Data

Aug. 27, 2003 (JP) .................. 2003-302782

(51) Int. Cl.
*B23P 19/00* (2006.01)
(52) U.S. Cl. ............ 29/740; 29/739; 29/741; 29/742; 29/743
(58) Field of Classification Search .......... 29/740, 29/739, 832, 729, 721, 741, 742, 743, 407.01; 414/744.1, 744.3, 744, 4; 901/40, 47; 294/64.1, 294/64.2
See application file for complete search history.

(56) References Cited

U.S. PATENT DOCUMENTS

| | | | |
|---|---|---|---|
| 4,868,973 A | 9/1989 | Fujishiro | |
| 5,033,185 A | 7/1991 | Hidese | |
| 5,894,657 A | 4/1999 | Kanayama et al. | |
| 6,176,007 B1 | 1/2001 | Kashiwagi et al. | |
| 6,259,966 B1* | 7/2001 | Izumida et al. | 700/229 |
| 6,386,432 B1 | 5/2002 | Jin et al. | |
| 6,389,683 B1* | 5/2002 | Mori et al. | 29/740 |
| 6,681,468 B1* | 1/2004 | Uchiyama et al. | 29/407.01 |
| 6,792,676 B2* | 9/2004 | Haji et al. | 29/832 |
| 2001/0005602 A1 | 6/2001 | Mimata et al. | |
| 2003/0071109 A1 | 4/2003 | Arikado | |

FOREIGN PATENT DOCUMENTS

| | | |
|---|---|---|
| JP | 56-94638 | 7/1981 |
| JP | 7-135228 | 5/1995 |
| JP | 2001-274596 | 10/2001 |
| JP | 2003-7731 | 1/2003 |
| JP | 2003-115698 | 4/2003 |
| JP | 2003-124238 | 4/2003 |

* cited by examiner

*Primary Examiner* — Derris H Banks
*Assistant Examiner* — Tai Nguyen
(74) *Attorney, Agent, or Firm* — Wenderoth, Lind & Ponack, L.L.P.

(57) ABSTRACT

A component mounting apparatus for mounting a plurality of components on a board. The apparatus is provided with a board holding device for holding the board at a board holding position, a first mounting head for holding and taking out a component fed from a first component feeding position and mounting the component on the board held at the board holding position, a second mounting head for holding and taking out the component fed from a second component feeding position and mounting the component on the held board, and a component feeding device having a wafer holding table for holding a wafer on which the respective components are fed so that the wafer holding table can be moved reciprocationally between the first component feeding position and the second component feeding position.

8 Claims, 15 Drawing Sheets

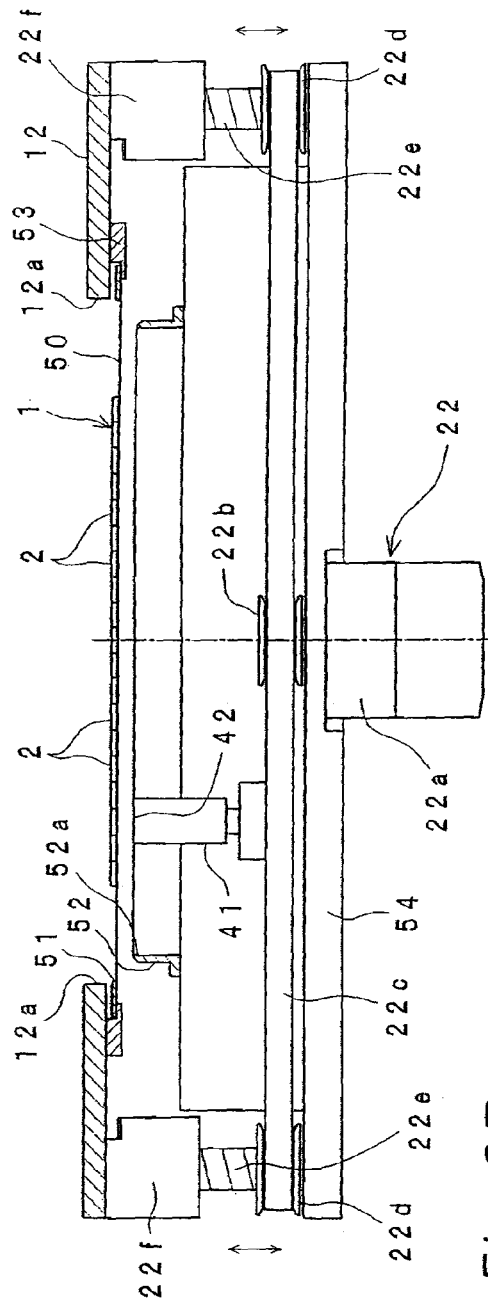
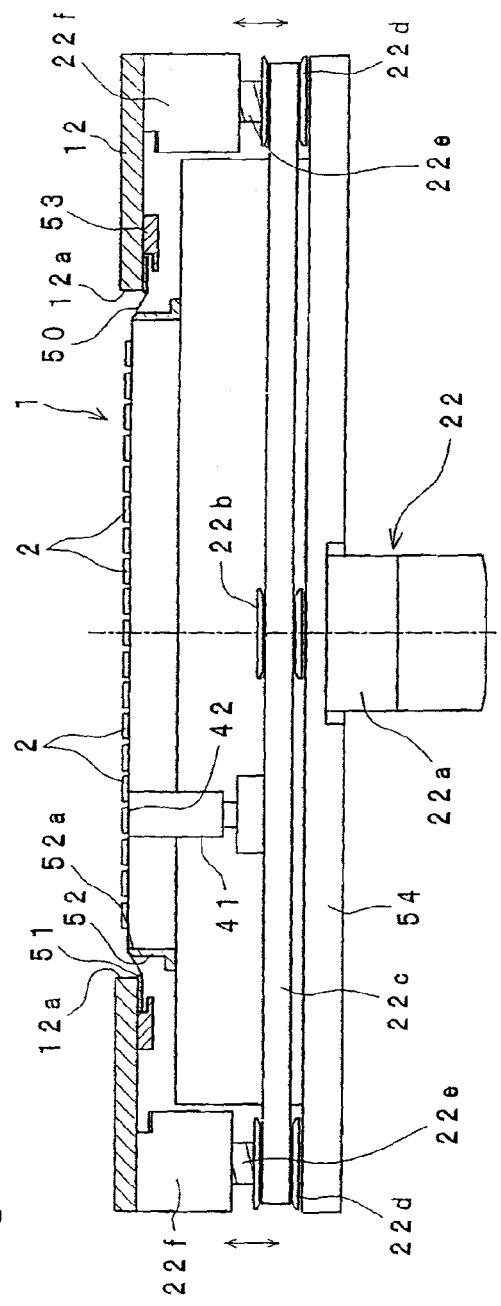

COMPONENT MOUNTING APPARATUS

This is a divisional application of Ser. No. 10/564,275, filed Jan. 11, 2006 now U.S. Pat. No. 7,437,818, which is a National Stage of International Application No. PCT/JP2004/012600, filed Aug. 25, 2004.

BACKGROUND OF THE INVENTION

1. Technical Field

The present invention relates to a component mounting apparatus and a component mounting method for mounting a plurality of components of semiconductor chips fed from a diced wafer on a board.

2. Description of Related Art

Conventionally, it has been required that in a component mounting operation in which a semiconductor chip is mounted as a component, the positional accuracy (mounting accuracy) for the semiconductor chip mounted on a circuit board should be improved as much as possible. This mounting accuracy improvement allows a sophisticated electronic circuit to be formed.

In such a conventional component mounting apparatus, on a wafer holding table which holds one disk-shaped-wafer having a plurality of semiconductor chips divided into a lattice shape by dicing, by pushing up the respective semiconductor chips from the bottom surfaces individually with a push-up pin, the pushed-up semiconductor chips are held and picked up (that is, taken out) by a pickup nozzle from the wafer (for example, see Japanese unexamined patent publication No. 2001-274596).

Such a wafer, being stuck onto a wafer sheet which is generally stretchable, is held by the wafer holding table through the wafer sheet, and it is characterized in that the wafer holding table itself tends to generate shakes and vibrations caused by movement thereof. Consequently, the highly accurate and secure pickup of the semiconductor chip is achieved by fixing the wafer holding table securely so as to prevent shake and vibration caused by the movement thereof, and by moving the push-up pin and the pickup nozzle so as to align the fixed wafer holding table with the semiconductor chip to be picked up.

SUMMARY OF THE INVENTION

Recently, as electronic circuits formed by such component mounting have been diversified, a wide variety of semiconductor chips have been produced in themselves. Since electronic circuits and semiconductor chips have been thus diversified, component mounting styles have also been diversified, and consequently, as well as the conventional "high positional accuracy", more often, it has been the case that "high productivity" is required for the component mounting instead of this "high positional accuracy".

In order to achieve this high productivity in component mounting, one solution is that high productivity is achieved by pluralizing each component part in a component mounting apparatus, and for example, holding a plurality of boards simultaneously so as to allow component mounting to be conducted on each board by a plurality of head sections simultaneously. Another solution is to provide a plurality of component feeding sections, that is, wafer holding tables.

As for the component mounting apparatus, however, when all the component parts are merely pluralized, the device becomes larger in size and higher in cost with the result that this has the opposite effect in that improvement in productivity is potentially prevented.

Accordingly, an object of the present invention is, in order to solve the above problem, to provide a component mounting apparatus and a component mounting method, which improve the productivity in the component mounting for mounting components on a board which are a plurality of semiconductor chips fed from a diced wafer by feeding the components efficiently.

In accomplishing these and other aspects, according to a first aspect of the present invention, there is provided a component mounting apparatus for mounting a plurality of components of semiconductor chips fed from a diced wafer on a board. The component mounting apparatus comprises:

a board holding device for holding the board fed to the component mounting apparatus releasably at a board holding position;

a first mounting head for holding and taking out the component fed from a first component feeding position and mounting the component on the board held at the board holding position;

a second mounting head for holding and taking out the component fed from a second component feeding position and mounting the component on the board held at the board holding position; and a component feeding device which is provided with a wafer holding table for holding the wafer and a table moving device for moving the wafer holding table reciprocationally between the first component feeding position and the second component feeding position, so as to feed the component from the wafer to each moving head at each component feeding position.

According to a second aspect of the present invention, there is provided a component mounting apparatus as defined in the first aspect, wherein the board holding device has a first board holding position where the board on which the component is mounted by the first mounting head is held, and a second board holding position where the board on which the component is mounted by the second mounting head is held, as the board holding positions, further comprising:

a first head moving device for moving the first mounting head roughly along a surface of the board independently so as to move between the first board holding position and the first component feeding position; and a second head moving device for moving the second mounting head roughly along the surface of the board independently so as to move between the second board holding position and the second component feeding position.

According to a third aspect of the present invention, there is provided a component mounting apparatus as defined in the second aspect, wherein in the component feeding device, the wafer holding table has a holding portion for holding a wafer sheet which sticks the respective components onto a top surface of the wafer sheet;

a push-up device is further provided for pushing up one component of the respective components to peel the one component from the wafer sheet so that the one component is fed; and the push-up device is moved reciprocationally between the first component feeding position and the second component feeding position, together with the wafer holding table.

According to a fourth aspect of the present invention, there is provided a component mounting apparatus as defined in the third aspect, wherein the push-up device comprising:

a push-up pin for pushing up the component from below of the wafer sheet;

a push-up pin holding section for holding the push-up pin liftably which has a sheet contact portion in contact with a bottom surface of the wafer sheet; and a push-up pin elevator for lifting up and down the push-up pin between a storing position where a push-up tip of the push-up pin is stored inside the sheet contact portion and a push-up position where the component is pushed up through the wafer sheet, located in an upper position than the sheet contact portion, wherein the push-up device is moved with the wafer holding table, bringing the sheet contact portion into contact with the wafer sheet in a condition in which the push-up pin is located at the storing position by the push-up pin elevator.

According to a fifth aspect of the present invention, there is provided a component mounting apparatus as defined in the fourth aspect, wherein the push-up device is provided with a push-up pin relative movement device for moving the push-up pin holding section and the wafer sheet relatively to each other along the surface of the wafer sheet, and an alignment of the one component with the push-up pin is conducted by the relative movement of the push-up pin relative movement device in a condition in which the sheet contact portion of the push-up pin holding section is in contact with the wafer sheet.

According to a sixth aspect of the present invention, there is provided a component mounting apparatus as defined in the second aspect, further comprising a component recognition device for recognizing positions of the respective fed components on the wafer holding table corresponding the wafer holding table located at a component recognition position which is located between the first component feeding position and the second component feeding position.

According to a seventh aspect of the present invention, there is provided a component mounting apparatus as defined in the sixth aspect, wherein the first mounting head is provided with a plurality of component holding members for holding the component releasably; and a control device is provided for controlling the component feeding device to move the wafer holding table to the component recognition position, controlling the component recognition device to recognize positions of the respective components which are held and taken out by the respective component holding members of the first mounting head at the component recognition position, controlling the component feeding device to move the wafer holding table to the first component feeding position, and controlling the first head moving device to hold and take out the respective components based on recognition results of the respective positions at the first component feeding position by the component holding members in order.

According to an eighth aspect of the present invention, there is provided a component mounting apparatus as defined in the second aspect, wherein the first mounting head and the second mounting head are further provided with a head-mounted component recognition device for recognizing the positions of the respective fed components on the wafer holding table corresponding to the wafer holding table which is located at either the first component feeding position or the second component feeding position.

According to a ninth aspect of the present invention, there is provided a component mounting apparatus as defined in the second aspect, wherein a control device is provided, for controlling the first head moving device and the first mounting head to hold and take out the component by the first mounting head at the first component feeding position, to move the first mounting head to the board holding position with the held component, to mount the held component on the board, and to return the first mounting head to the first component feeding position, and for controlling the component feeding device, the second head moving device and the second mounting head to move the wafer holding table from the first component feeding position to the second component feeding position, to hold and take out the component by the second mounting head at the second component feeding position, and to return the wafer holding table to the first component feeding position to be located there, until arriving of the first mounting head at the first component feeding position.

According to a tenth aspect of the present invention, there is provided a component mounting method for mounting a plurality of components of semiconductor chips fed from a diced wafer on a board, wherein in a component mounting apparatus which is provided with a first mounting head for holding and taking out the component fed from a first component feeding position to mount the component on the board held at a board holding position, a second mounting head for holding and taking out the component fed from a second component feeding position to mount the component on the board held at the board holding position, and a wafer holding table which is moved reciprocationally between the first component feeding position and the second component feeding position, for holding the wafer so that that the respective components are fed, wherein holding and taking out the component by the first mounting head at the first component feeding position, moving the first mounting head to the board holding position with the held component, mounting the held component on the board, and then returning the first mounting head to the first component feeding position, until arriving of the first mounting head at the first component feeding position, moving the wafer holding table from the first component feeding position to the second component feeding position, holding and taking out the component by the second mounting head at the second component feeding position, and then returning the wafer holding table to the first component feeding position to be located there.

According to an eleventh aspect of the present invention, there is provided a component mounting method as defined in the tenth aspect, wherein in a process in which moving the wafer holding table from the first component feeding position to the second component feeding position, recognizing a position on the wafer holding table of the component held and taken out by the second mounting head.

According to a twelfth aspect of the present invention, there is provided a component mounting method as defined in the tenth aspect, wherein locating the wafer holding table at the first component feeding position, recognizing positions on the wafer holding table of the respective fed components by a head mounted component recognition device provided for the first mounting head, and holding and taking out the respective components by the first mounting head based on the recognition result.

According to a thirteenth aspect of the present invention, there is provided a component mounting method as defined in the eleventh aspect, wherein recognizing a positional shift amount of holding attitude of the component by the component holding member provided for the second mounting head, and correcting the recognition position of the component on the wafer holding table based on the recognition result of the positional shift amount.

According to the first aspect of the present invention, since the component mounting apparatus which has two mounting heads of the first mounting head and the second mounting head is provided with one wafer holding table for holding a wafer so as to move reciprocationally between the first component feeding position for feeding a component to the first mounting head and the second component feeding position for feeding a component to the second mounting head, respective components can be fed efficiently as well as the device structure is simplified so that the device cost can be reduced.

Particularly, the point that only one wafer holding table is provided for the two mounting heads, the wafer holding table is characterized in that it has a complex structure, that its device size is large and that it is a relatively expensive device, greatly contributes to the structure simplification and the cost reduction of the device.

While the component is held and taken out from the wafer by one mounting head by reciprocating the wafer holding table between the first component feeding position and the second component feeding position to feed the respective components to the first mounting head and the second mounting head alternately, the respective held components can be mounted on the board by the other mounting head. That is, the time required for holding and taking out the component by the one mounting head and the time required for mounting the component by the other mounting head can be overlapped each other. Therefore, components can be efficiently mounted as well as the device structure is simplified. Consequently, the component mounting apparatus can be provided which improves its productivity by feeding components efficiently in component mounting.

According to the second aspect of the present invention, the board holding device, which has a first board holding position and a second board holding position as the board holding positions, is provided with a first head moving device for moving the first mounting head independently between the first board holding position and the first component feeding position, and a second head moving device for moving the second mounting head independently between the second board holding position and the second component feeding position so that the efficient operation such that the one mounting head mounts a component while the other mounting head holds and takes out a component is achieved with the result that the productivity in component mounting can be improved.

According the third aspect of the present invention, since a push-up device for peeling by pushing up one component from a wafer sheet can move reciprocationally between the first component feeding position and the second component feeding position together with the wafer holding table (for example, integrally), the one component is directly pushed up by the push-up device after the wafer holding table is located at the first component feeding position or at the second component feeding position. Therefore, even when the wafer holding table moves in such a way, push-up operation can be immediately started so that the time required for holding and taking out each component is reduced, with the result that productive component mounting can be achieved.

According to the fourth aspect of the present invention, since the wafer holding table moves in a condition in which a push-up pin is located at a storing position and in which a sheet contact portion is constantly in contact with the wafer sheet, the generation of the shake and vibration of the wafer sheet caused by the movement of the wafer holding table can be preliminarily prevented or reduced. As a result, the reciprocational movement of the wafer holding table can be achieved.

According to the fifth aspect of the present invention, since a push-up pin relative movement device is provided for moving a push-up pin holding section of the push-up device and the wafer sheet relatively to each other, the alignment of the push-up pin with the one component can be conducted by moving the push-up pin holding section freely even in the middle of the movement of the wafer holding table. Therefore, also in this regard, the time required for the push-up operation of the respective components, that is, time required for holding and taking out the respective components can be reduced, with the result that productive component mounting can be achieved.

According to the sixth aspect of the present invention, since a component recognition position is located between the first component feeding position and the second component feeding position to allow the position of each component fed at the component recognition position on the wafer holding table to be recognized by the component recognition device, the positions of the respective fed components can be recognized in the middle of the movement of the wafer holding table between the first component feeding position and the second component feeding position with the result that efficient recognition operation can be conducted.

According to the seventh aspect of the present invention, the wafer holding table is located at the component recognition position to recognize the respective components which are held and taken out, and the wafer holding table is then located at the first component feeding position to hold and take out the respective components in order, based on the recognition results of the respective components by each component holding member provided for the first mounting head, with the result that a component can be held and taken out (that is, feed) correctly and efficiently.

According to the eight aspect of the present invention, since the respective mounting heads are provided with a head mounted component recognition device for recognizing the positions of the respective components from the wafer holding tables which is located at the respective component feeding positions, the generation of the positional shift caused by the difference between the component recognition position and the component feeding position is prevented so as to recognize the positions of the respective components correctly. As a result, a component of such a fine size that the positional shift becomes problematic is securely held and taken out, with the result that secure component mounting can be conducted.

According to the ninth and tenth aspect of the present invention, since the time required for mounting a component by the first mounting head and the time required for feeding a component to the second mounting head can be overlapped each other, the device structure is simplified as well as efficient component mounting is conducted with the result that the productivity in component mounting is improved.

According to the eleventh aspect of the present invention, in a process in which the wafer holding table moves from the first component feeding position to the second component feeding position, the position on the wafer holding table of the component which is held and taken out by the second mounting head is recognized to conduct the secure component recognition to hold and take out a component efficiently, with the result that the productivity in component mounting is further improved.

According to the twelfth aspect of the present invention, the generation of the positional shift caused by the difference between a component recognition position and a component feeding position is prevented to recognize the positions of the respective components correctly. As a result, a component of such a fine size that the positional shift becomes problematic is securely held and taken out, with the result that secure component mounting can be conducted.

According to the thirteenth aspect of the present invention, since recognizing the holding attitude of the component held by the component holding member and then correcting the recognition position of the held component on the wafer holding table based on the recognition result, the positional shift amount caused by the difference between the component recognition position and the component feeding position can be corrected with the result that secure component mounting can be conducted.

BRIEF DESCRIPTION OF THE DRAWINGS

These and other aspects and features of the present invention will become clear from the following description taken in conjunction with the preferred embodiments thereof with reference to the accompanying drawings, in which:

FIG. 3A is a schematic sectional view of a holding table and an expander provided for the component feeding device of FIG. 2 showing a condition in which a wafer is not expanded, and FIG. 3B is a schematic sectional view of the holding table and the expander provided for the component feeding device of FIG. 2 showing a condition in which the wafer is expanded;

FIG. 15A shows the sucking and holding attitude by the suction nozzle which firstly sucks and takes out, FIG. 15B shows the sucking and holding attitude by the suction nozzle which secondly sucks and takes out, and FIG. 15C shows the sucking and holding attitude by the suction nozzle which lastly sucks and takes out.

DETAILED DESCRIPTION OF THE INVENTION

Figure 1:
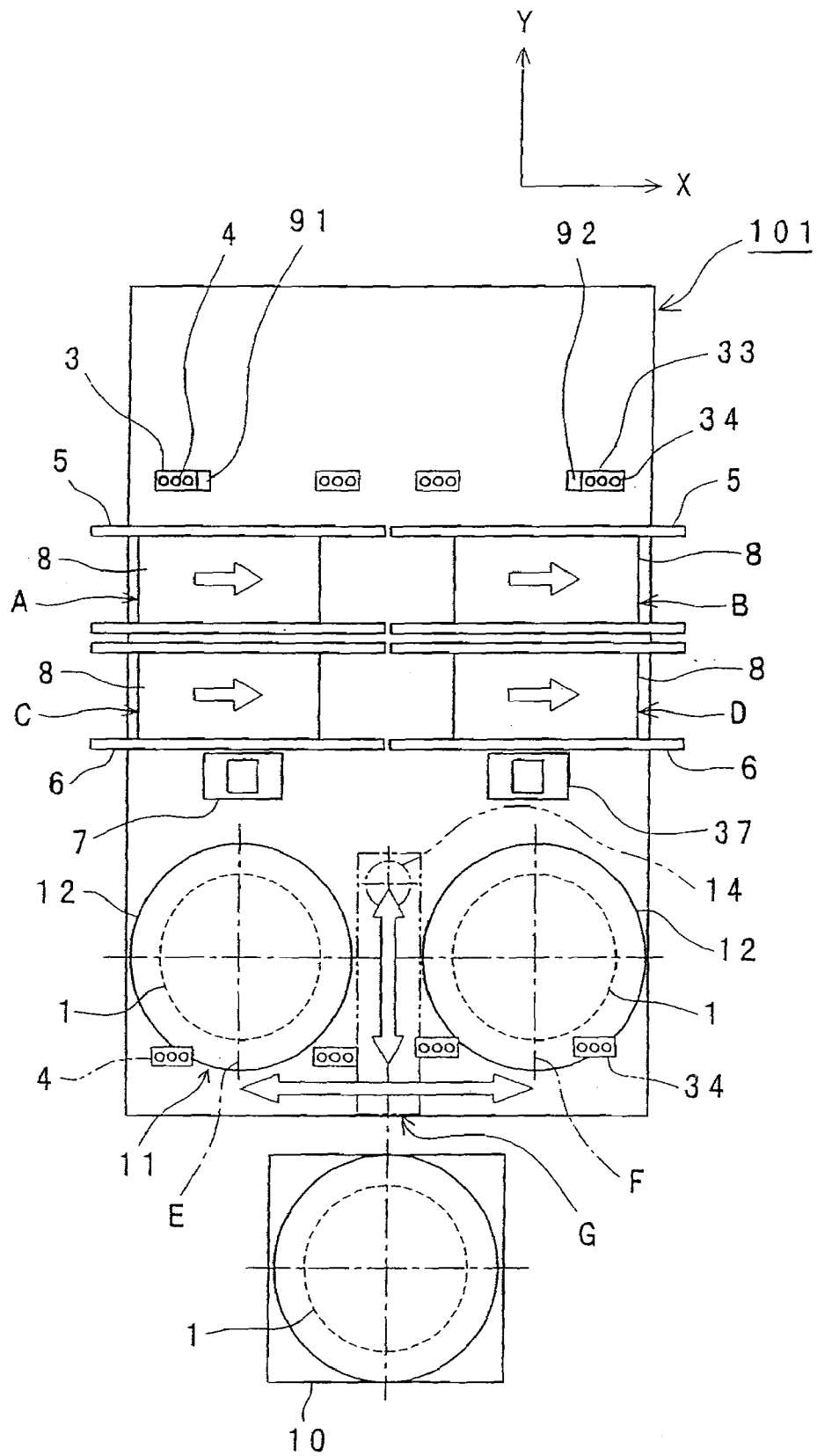
FIG. 1 is a schematic plan view of the component mounting apparatus of one embodiment of the present invention.

Before the description of the present invention proceeds, it is to be noted that like parts are designated by like reference numerals throughout the accompanying drawings.

An embodiment will be described in detail with reference to the accompanying drawings according to the present invention.

FIG. 1 shows a schematic perspective view of the schematic structure of a component mounting apparatus 101 as an example of a component mounting apparatus according to one embodiment of the present invention.

As shown in FIG. 1, the component mounting apparatus 101 is a device for mounting semiconductor chips as an example of components fed from a diced wafer on a circuit board as an example of a board. The component mounting apparatus 101 is provided with a board carrying device for carrying a fed circuit board 8 as well as holding the fed circuit board 8 releasably at a board holding position which is a prescribed position in a carrying direction. As shown in FIG. 1, the board carrying device is provided with two pairs of carrying rails which are adjoining each other, that is carrying rails 5 and carrying rails 6, for supporting the circuit board 8 fed from the left of the component mounting apparatus 101 in the figure and carrying the circuit board 8 to the right in the figure. It is to be noted that in FIG. 1, the horizontal direction in the figure is set to the X-axis direction, the direction orthogonal this X-axis direction is set to the Y-axis direction, and the carrying rails 5 and the carrying rails 6 are respectively arranged along the X-axis direction. The two pairs of the carrying rails 5 and the carrying rails 6 are respectively provided with the two board holding positions, wherein the left side of the carrying rails 5 in the figure is set to a first board holding position A, the right side of the carrying rails 5 in the figure is set to a second board holding position B, the left side of the carrying rails 6 in the figure is set to a third board holding position C, and the right side of the carrying rails 6 is a fourth board holding position D. Since the board holding device is thus constituted, the component mounting apparatus 101 can simultaneously hold four circuit boards 8 in total to conduct component mounting. It is to be noted that the carrying rails 5 and the carrying rails 6 are examples of board holding devices in this embodiment.

Also as shown in FIG. 1, the component mounting apparatus 101 is provided with a first head section 4 for mounting the components on the circuit board 8 held at the first board holding position A and the third board holding position C as an example of the first mounting head, and a second head section 34 for mounting the components on the circuit board 8 held at the second board holding position B and the fourth board holding position D as an example of the second mounting head. The first head section 4 and the second head section 34 are respectively provided with three suction nozzles 3 and 33, for example, as examples of component holding members for sucking and holding the semiconductor chip releasably.

On the underside of the component mounting apparatus 101 in the figure, there is provided a component feeding device 11 which has a holding table 12 as an example of a wafer holding table for holding a wafer 1 so that each semiconductor chip can be fed. The component feeding device 11 is arranged so that the holding table 12 can move reciprocationally along the X-axis direction in the figure between a first component feeding position E located adjacent to the left corner in the figure and a second component feeding position F located adjacent to the right corner in the figure on the base of the component mounting apparatus 101. A wafer recognition position G is located between the first component feeding position E and the second component feeding position F as an example of a component recognition position, and a wafer camera 14 is located above the wafer recognition position G as an example of a component recognition device for recognizing the position of each semiconductor chip on the wafer 1 by taking the picture of each of the semiconductor chip on the wafer 1 which is located at the component recognition position G. It is to be noted that the wafer camera 14 can move along the Y-axis direction in the figure.

Also as shown in FIG. 1, there is provided a wafer magazine 10 for accommodating a plurality of wafers 1 on the front side of the base of the component mounting apparatus 101 in the figure so that the wafers 1 can be fed to the component feeding device 11. The wafer magazine 10 can feed the accommodated wafer 1 to the holding table 12 which is located at the wafer recognition position G.

Also as shown in FIG. 1, the first head section 4, can move reciprocationally between the first board holding position A and the third board holding position C, and the first component feeding position E, as well as can move in the X-axis direction and the Y-axis direction in the figure, which are the directions roughly along the surface of the circuit board 8, and the component mounting device 101 is provided with a first head moving device (not shown) for assuming the relevant movement (a first XY robot, for example). Similarly, the second head section 34 can move reciprocationally between the second board holding position B and the fourth board holding position D, and the second component feeding position F, as well as can move in the X-axis direction and the Y-axis direction in the figure, and the component mounting device 101 is provided with a second head moving device (not shown) for assuming the relevant movement (a second XY robot, for example).

Also as shown in FIG. 1, the moving range of the first head section 4 by the first XY robot is determined so that the any one of suction nozzles 3 equipped with the first head section 4 can be located above an arbitrary position on the wafer 1 which is located at the first component feeding position E, and can be located above an arbitrary position on the circuit boards 8 which are held at the first board holding position A and the board holding position C. Similarly, the moving range of the second head section 34 by the second XY robot is determined so that the any one of the suction nozzles 33 equipped with the second head section 34 can be located above an arbitrary position on the wafer 1 which is located at the second component feeding position F, and can be located above an arbitrary position on the circuit boards 8 which are held at the second board holding position B and the fourth board holding position D.

There is further provided a first component recognition camera 7 on the base located between the first component feeding position E and the third board holding position C, for recognizing the sucking and holding attitude of the semiconductor chip by taking a picture of the semiconductor chips which are sucked and held by the respective suction nozzles 3 of the first head section 4. Similarly, there is a second component recognition camera 37 on the base located between the second component feeding position F and the fourth board holding position D, for recognizing the sucking and holding attitude of the semiconductor chip by taking a picture of the semiconductor chips which are sucked and held by the respective suction nozzles 33 of the second head section 34.

Figure 2:
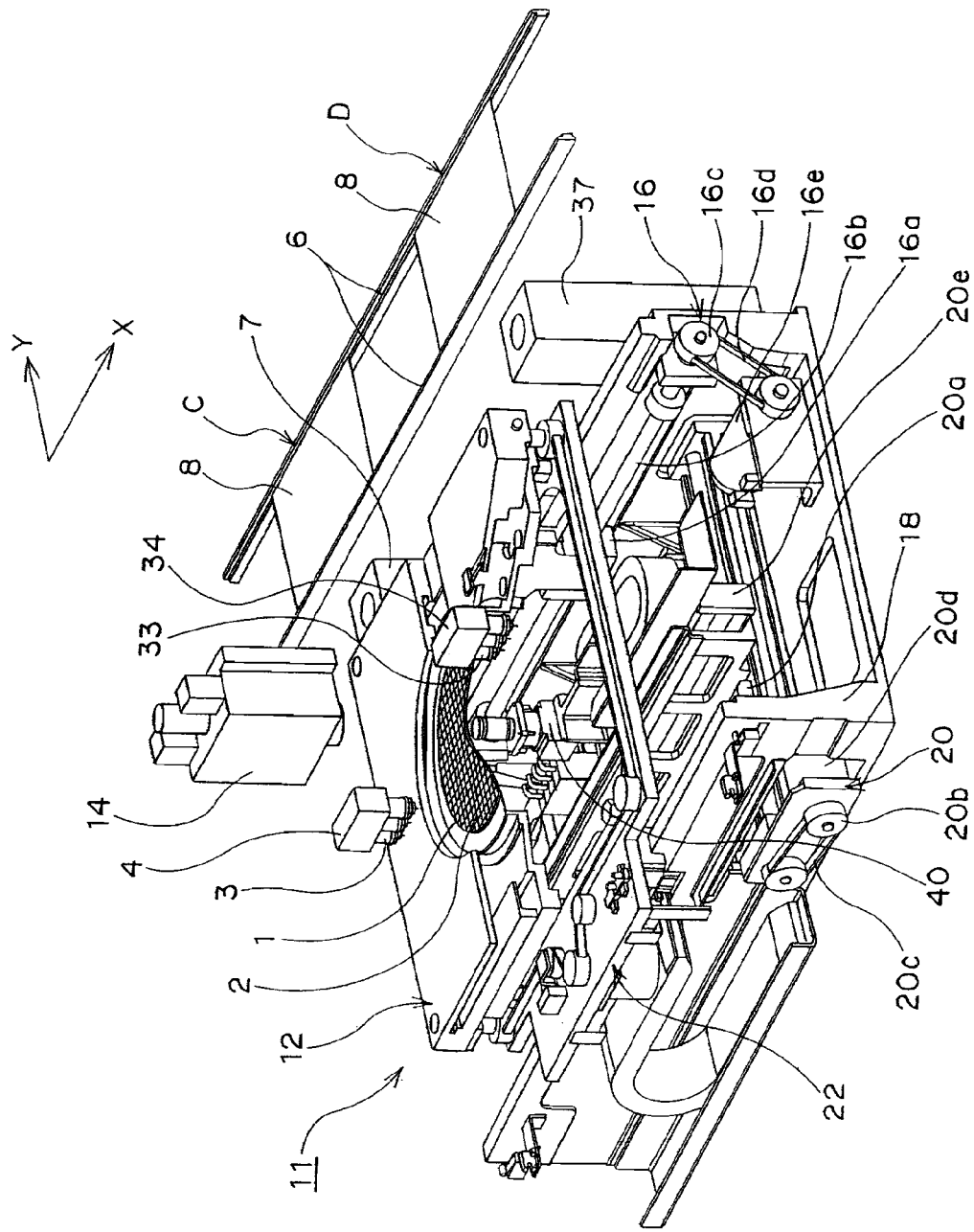
FIG. 2 is a perspective view of a component feeding device provided for the component mounting apparatus of FIG. 1.

FIG. 2 is a perspective view (partly broken away to show interior construction) which mainly shows the structure of the component feeding device 11 in the component mounting apparatus 101 having such a structure, and the structure of the component feeding device 11 will be described in further detail based on FIG. 2 hereinafter.

As shown in FIG. 2, the component feeding device 11 is provided with a table supporting frame 18 for holding the holding table 12 so that the holding table 12 can move along the X-axis direction in the figure and a table moving device 16 for driving the holding table 12 to move along the X-axis direction (that is, the reciprocational movement between the first component feeding position E and the second component feeding position F). The component feeding device 11 is further provided with a push-up device 40 for pushing up an intended semiconductor chip 2 from the bottom surface, of the respective semiconductor chips 2 provided for the wafer 1 which is held by the holding table 12, and a push-up device moving device 20 which is an example of a push-up pin relative movement device for moving the push-up device 40 along the X-axis direction or the Y-axis direction in the figure to allow for the alignment of the intended semiconductor chip 2 for pushing up.

FIG. 3A and FIG. 3B are schematic sectional views showing the structure of the holding table 12 provided for the component feeding device 11. As shown in FIG. 3A, the disk-shaped-wafer 1, which is diced, is stuck onto the top surface of the wafer sheet 50 which is stretchable so that the wafer 1 can be peeled therefrom. The wafer sheet 50 is stuck onto the inner surface of the wafer ring 51 which is circularly formed, and since this wafer ring 51 is held by the ring holding section 53 (as example of a holding portion) of the holding table 12, the wafer 1 is held. It is to be noted that the holding table 12 has an inner hole of roughly the same size of the size of the inner diameter of the wafer ring 51, and that the wafer 1, which is stuck on the wafer sheet 50 from the inner hole 12a, is constantly exposed.

As shown in FIG. 3A, there is provided a circular expanding member 52 below the wafer sheet 50 which has a hole of a larger size than the size of the outer diameter of the wafer 1 and of a smaller size than the size of the inner diameter of the wafer ring 51. This expanding member 52, as shown in FIG. 3B, is a member for expanding the diced wafer 1 by bringing the wafer sheet 50 into contact with a contact portion 52a, which is the upper end of the wafer sheet 50 as well as by stretching the wafer sheet 50 radially with the contact portion 52a as the fulcrum.

The holding table 12 is supported by a frame 54 through an expander 22 as an example of an elevator for moving the holding table 12 up and down. The expander 22 is provided with a nut part 22f which is fixed on the respective bottom surfaces of the four corners of the holding table 12, a ball screw shaft part 22e which is screwed in each nut part 22f and fixed to the frame 54 so that the lower end of the ball screw shaft part 22e can rotate, a roller 22d which is fixed to each ball screw shaft part 22e, a drive motor 22a which is provided with a roller 22b in its drive shaft, and a drive belt 22c for transmitting the rotary drive of the roller 22b to each roller 22d. It is to be noted that the drive motor 22a can be rotated and driven in either direction of the normal and reverse directions.

Since the holding table 12 and the expander 22 are thus constituted, the nut part 22 screwed in each of the ball screw shaft part 22e is moved down so as to move down the holding table 12 by rotating and driving the drive motor 22a in either direction of the normal and reverse directions as shown in FIG. 3B. Consequently, the wafer sheet 50 is radially stretched with the contact portion 52a as the fulcrum by moving down the wafer sheet 50 arranged above the expanding member 52 to make contact with the contact portion 52a to further move down the wafer sheet 50. This allows the wafer 1 to be expanded so that the arrangement interval between each of the semiconductor chips 2 making up the wafer 1 can be broadened (that is, a condition in which a gap is formed between the semiconductor chips 2 adjacent to each other). The wafer 1 is thus expanded so that when each semiconductor chip 2 is pushed up to be taken out, the interference and the like by the relevant semiconductor chip 2 to be taken out to another semiconductor chip 2 adjacent thereto can be prevented, and consequently, the relevant semiconductor chip 2 can be taken out smoothly.

Figure 4:
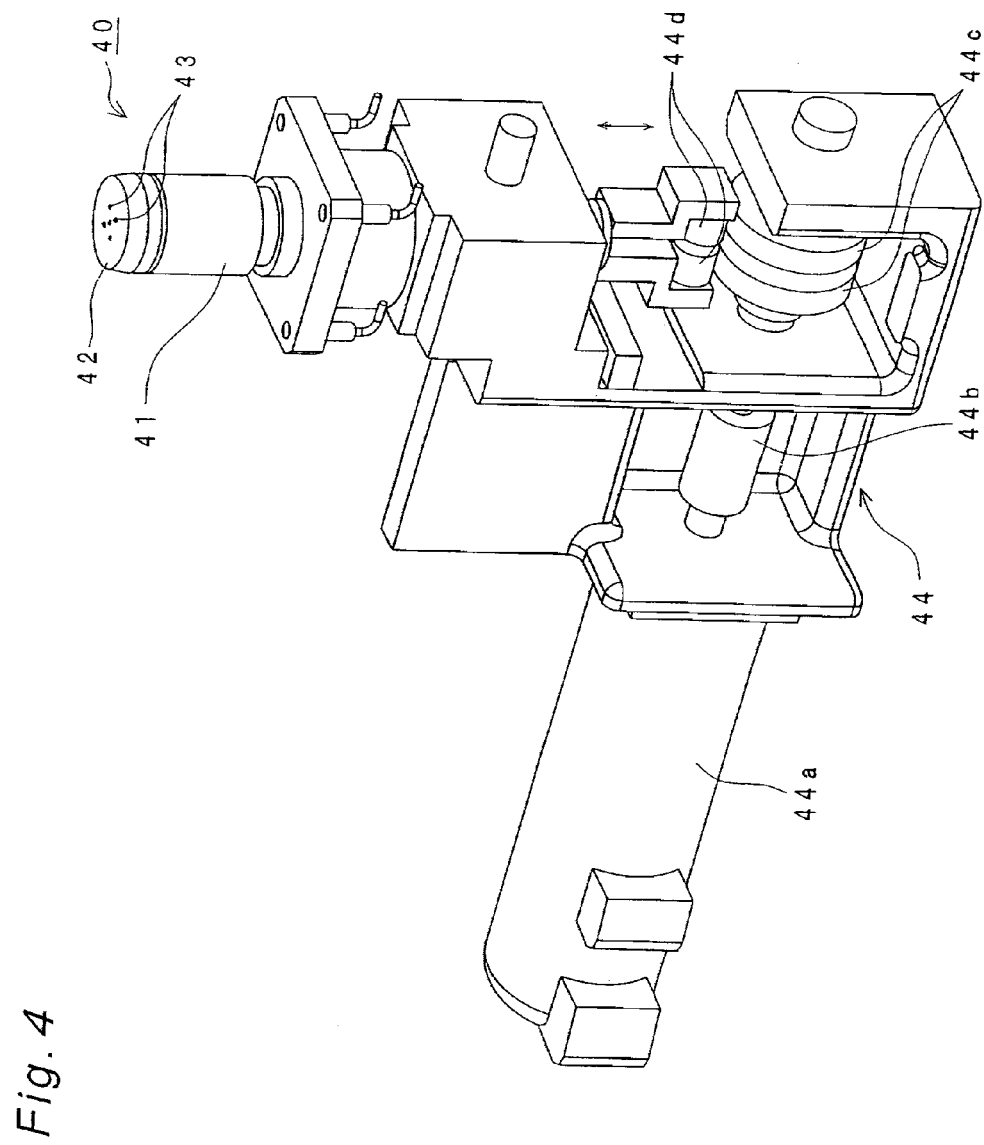
FIG. 4 is an external perspective view of a push-up device provided for the component feeding device of FIG. 2.

Next, FIG. 4 shows an enlarged perspective view of the push-up device 40 in the component feeding device 11. As shown in FIG. 4, the push-up device 40 is provided with a push-up pin holding section 41 for incorporating and holding a push-up pin for pushing up the semiconductor chip 2 stuck onto the wafer sheet 50 from the bottom surface, and a push-up pin elevator 44 for moving up and down this push-up pin.

Figure 5:
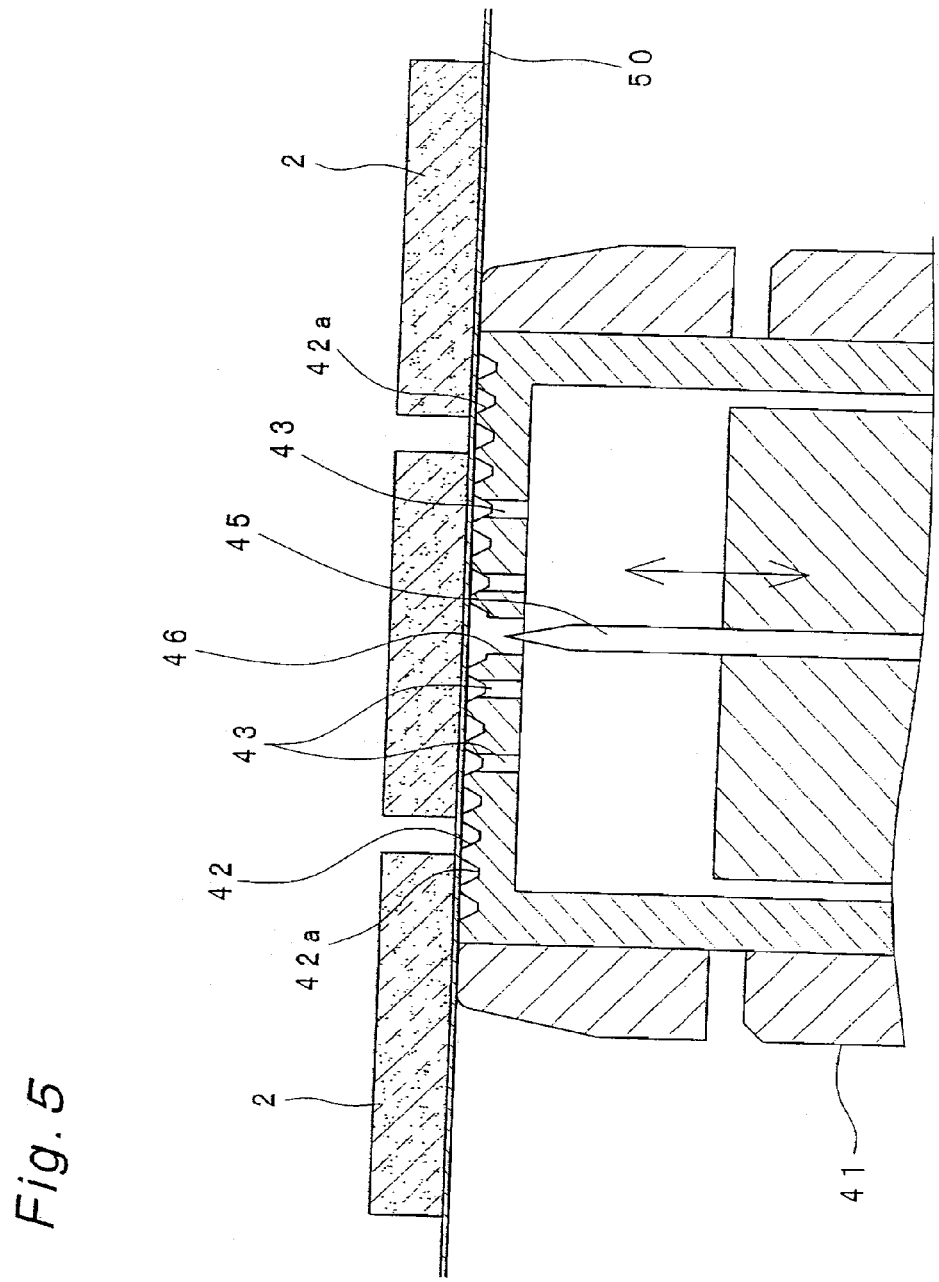
FIG. 5 is an enlarged schematic sectional view of a push-up pin holding section of the push-up device of FIG. 4 showing a condition in which the push-up pin is located at a storing position.

As shown in FIG. 4, the push-up pin holding section 41 is provided with a sheet contact surface 42, which is an example of a sheet contact portion for making contact with the wafer sheet 50 by the peripheral part thereof as well as for sucking and holding the wafer sheet 50. Here, FIG. 5 shows an enlarged schematic sectional view of the sheet contact surface 42 of the push-up pin holding section 41. As shown in FIG. 5, a plurality of suction holes 43 are formed on the sheet contact surface 42 so that the wafer sheet 50 can be brought into close contact with the sheet contact surface 42 to be held securely by sucking the wafer sheet 50 in contact with the sheet contact surface 42. A large number of recessed portions 42a, which are also formed on the sheet contact surface 42, compensate so that the peelability of the semiconductor chip 2 which is located above the sheet contact surface 42 from the wafer sheet 50 is improved by close contact as described above. A pin-storing hole 46 is formed roughly at the center of the sheet contact surface 42, and a push-up pin 45 is stored in the push-up pin holding section 41 so that the push-up pin 45 can protrude from this storing hole 46.

As shown in FIG. 4, the push-up pin elevator 44 employs the system in which the rotational movement by a drive motor is converted into vertical movement by a cam and a cam follower to move up and down the push-up pin 45. Specifically, the push-up pin elevator 44 is provided with a drive motor 44a for rotating and driving as described above, a cam part 44c which is fixed to the drive shaft 44b of this drive motor 44a and a cam follower part 44d which is in contact with this cam part 44c so that the rotational movement of the drive motor 44a can move up and down the cam follower 44d to transmit the relevant up and down movements to the push-up pin 45.

Figure 6:
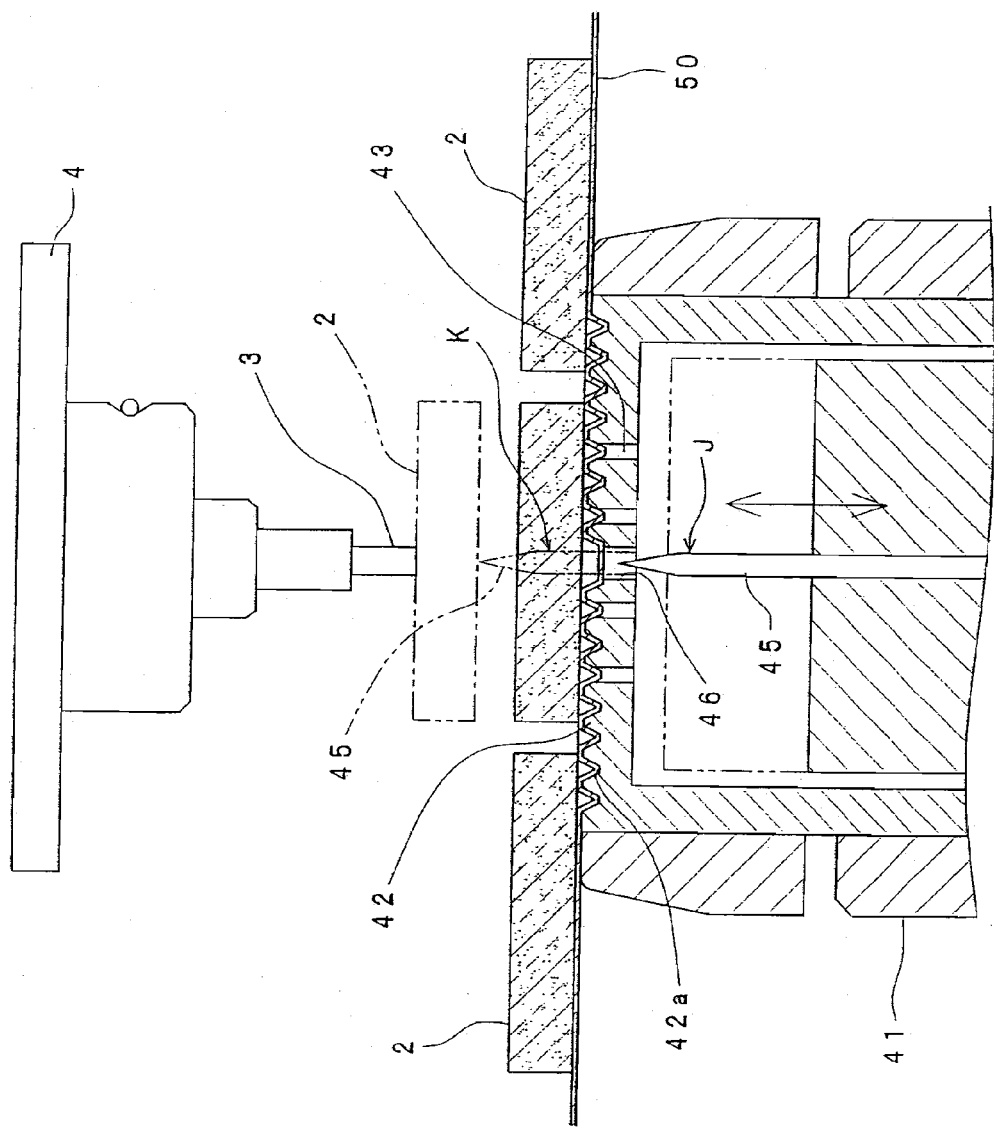
FIG. 6 is an enlarged schematic sectional view of the push-up pin holding section of the push-up device of FIG. 4 showing a condition in which the push-up pin is located at a push-up position.

Since the push-up pin elevator 44 is thus constituted, the push-up pin 45 can move up and down between a storing position J, which is a position where a push-up tip, that is, the upper peripheral part of the push-up pin 45 does not protrude from the storing hole 46, and a push up position K, which is a position where the push-up tip of the push-up pin 45 is located above the sheet contact surface 42 so as to be able to push up the semiconductor chip 2 as shown in FIG. 6. When the push-up pin 45 is moved up through the wafer sheet 50 to push up the bottom surface of the semiconductor chip 2 so that the bottom surface is peeled from the wafer sheet 50, since the wafer sheet 50 is sucked and held by the sheet contact surface 42, the relevant peeling can be easily and securely conducted.

As shown in FIG. 2, the push-up device 40 is provided with the push-up device moving device 20 which has an X-axis moving section 20e provided with a drive section (not shown) for supporting the push-up device 40 and moving the push-up device 40 in the X-axis direction in the figure, and a Y-axis moving section which is made up of a ball screw shaft part 20a which is screwed in a nut part (not shown) fixed to this X-axis moving section 20e, a drive motor 20d for rotating and driving this ball screw shaft part 20a, and a transmit roller 20b and a drive belt 20c for transmitting a relevant rotary drive to the ball screw shaft part 20a. The push-up device 40 can move in the X-axis direction or the Y-axis direction in the figure. Since the push-up device 40 can move in the X-axis direction or the Y-axis direction in the figure as described above, the alignment of the push-up pin 45 with the intended semiconductor wafer 2 in the wafer 1 for pushing up can be conducted.

Such an alignment is conducted, as shown in FIG. 5 for example, in the push-up pin holding section 41 where the push-up pin 45 is located at the storing position J, in a condition in which the sheet contact surface 42 is in contact with the bottom surface of a wafer sheet and in which the wafer sheet 50 is not sucked by each suction hole 43. In other words, as shown in FIG. 3A and FIG. 3B, the sheet contact surface 42 in the push-up pin holding section 41 is arranged so as to be located at a position roughly as high as the contact portion 52a of the expanding member 52 so that the bottom surface of the wafer sheet 50 which is expanded is constantly in contact with the sheet contact surface 42.

As shown in FIG. 2, the table-moving device 16 is provided with a nut part 16a which is fixed to the frame 54 for supporting the holding table 12, a ball screw shaft part 16b which is screwed in this nut part 16a and set in the X-axis direction in the figure, a drive motor 16e for rotating and driving this screw shaft part 16b, and a roller 16c and a drive belt 16d for transmitting the rotary drive by this drive motor 16e to the ball screw shaft part 16b. As a result, the holding table 12 can move along the X-axis direction in the figure through the ball screw shaft part 16b and the nut part 16a by rotating and driving the drive motor 16e in either direction of the normal and reverse directions.

Figure 7:
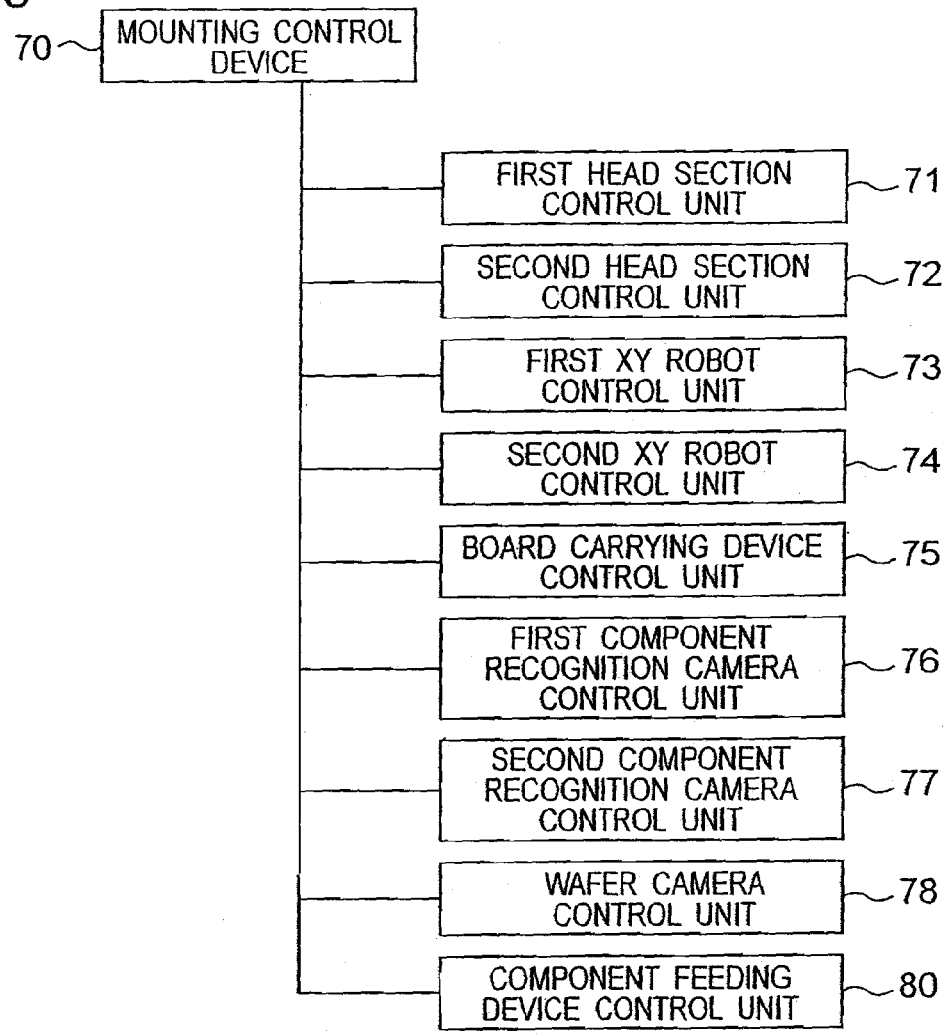
FIG. 7 is a block diagram showing the structure of a mounting control device of the component mounting apparatus.

Next, the control structure which controls each component in the component mounting apparatus 101 which has such a structure will be described. As shown in FIG. 7, the component mounting apparatus 101 is provided with a first head section control unit 71 for controlling the operation of the first head section 4, a second head section control unit 72 for controlling the operation of the second head section 34, a first XY robot control unit 73 for controlling the operation of the first XY robot, a second XY robot control unit 74 for controlling the operation of the second XY robot, a board carrying device control unit 75 for controlling the operation of the board carrying device on the carrying rails 5 and the carrying rails 6 and the like, a first component recognition camera control unit 76 for controlling the operations such as image pickup operation of the holding attitude of the semiconductor chip 2 by the first component recognition camera 7, a second component recognition camera control unit 77 for controlling the operations such as image pickup operation of the holding attitude of the semiconductor chip 2 by the second component recognition camera 37, a wafer camera control unit 78 for controlling the image pickup operation by the wafer camera 14, and a component feeding device control unit 80 for controlling the component feed operation by the component feeding device 11. The component mounting apparatus 101 is further provided with a mounting control device 70 which is an example of a control device for relating the control operations by the respective control units to one another to conduct the overall control. Since the component mounting apparatus 101 is thus provided with the mounting control device 70, the component mounting apparatus 101 can conduct an operation in which operations among the respective components are related to one another.

Figure 8:
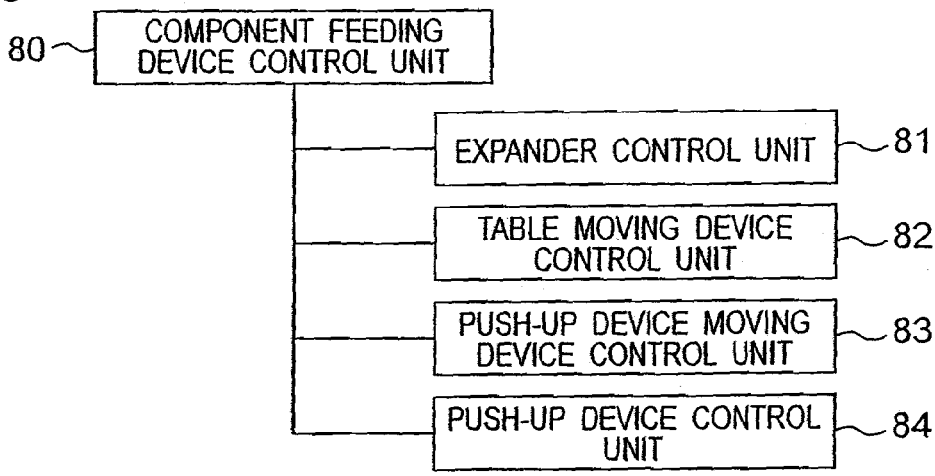
FIG. 8 is a block diagram showing the structure of a control unit of the component feeding device shown in FIG. 7.

FIG. 8 shows the structure of the component feeding device control unit 80 in further detail. As shown in FIG. 8, the component feeding device control unit 80, which is provided with an expander control unit 81 for controlling the expand operation by the expander 22, a table moving device control unit 82 for controlling the movement operation of the holding table 12 by the table moving device 16, a push-up device moving device control unit 83 for controlling the movement operation of the push-up device 40 in the X-axis direction or the Y-axis direction by the push-up device moving device 20, and a push-up device control unit 84 for controlling the push-up operation in the push-up device 40 and the suction operation in the wafer sheet 50, has a role to relate the control operations of the respective control units to one another to control the operations comprehensively.

Specifically, operations are conducted in the push-up device 40 such that when the push-up pin 45 is located at the push up position K or when the wafer sheet 50 is sucked and held onto the sheet contact surface 42 by each suction hole 43, the movement of the push-up device 40 by the push-up device moving device 20 and the movement of the holding table 12 by the table moving device 16 are forbidden to prevent the wafer sheet 50 from being damaged.

Also, for example, the operations can be conducted such that the movement operation of the holding table 12 in the X-axis direction by the table moving device 16 and the movement operation of the push-up device 40 in the X-axis direction by push-up device moving device 20 are synchronized with each other so as to prevent the interference between the push-up pin holding section 41 located inside the expanding member 52 and the expanding member 52.

In the component mounting apparatus 101 which has the structure as described above, the process of mounting operation will hereinafter be described from a step in which the semiconductor chip 2 is taken out of the wafer 1, until a step in which the semiconductor chip 2 is mounted on the circuit board 8, based on an operation explanatory diagram using a schematic plan view of the component mounting apparatus 101 shown in FIG. 9 to FIG. 13. It is to be noted that the respective operations which will be described below are comprehensively conducted as being related to one another by the mounting control device 70 provided for the component mounting apparatus 101.

Figure 9:
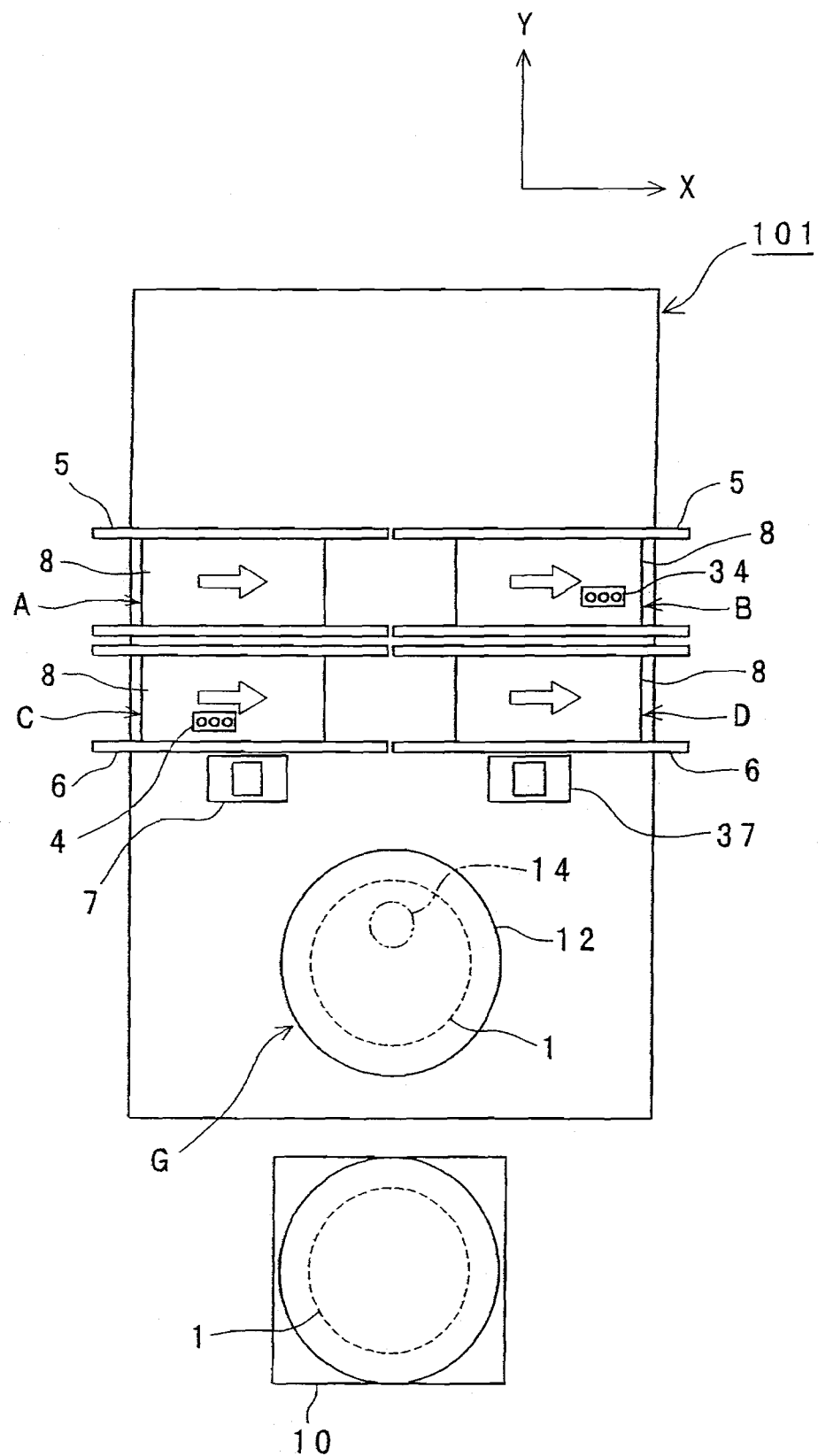
FIG. 9 is a schematic plan view which illustrates the process of the component mounting operation in the component mounting apparatus showing a condition in which a wafer taken out of a wafer magazine is held by a holding table.

As shown in FIG. 9, in the component mounting apparatus 101, the four circuit boards 8, as being held by the carrying rail 5 or the carrying rail 6, are carried to the right in the X-axis direction in the figure, so as to be located at the first board holding position A, the second board holding position B, the third board holding position C and the fourth board holding position D as well as the relevant carriers are stopped so that the four circuit boards 8 are releasably held at the respective positions.

One wafer 1 is chosen and taken out of the wafer magazine 10 which accommodates the plurality of wafers 1 therewith, and fed to the holding table 12 of the component feeding device 11 which is located at the wafer recognition position G to be held releasably. The wafer sheet 50 is then stretched by the expander 22 to expand the wafer 1. This expand operation allows the bottom surface of the wafer sheet 50 to be in contact with the sheet contact surface 42 of the push-up pin holding section 41 constantly. It is to be noted that the wafer sheet 50 has not been sucked and held by each of the suction hole 43 yet in this condition.

After that, for example, the semiconductor chip 2 to be mounted on the circuit board 8 which is held at the first board holding position A is chosen from the respective semiconductor chips 2 which make up of the wafer 1 being expanded, and the alignment of this chosen semiconductor chip 2 with the wafer camera 14 is conducted. It is to be noted that this alignment is conducted by moving the wafer camera 14 along the Y-axis direction and moving the holding table 12 by the table moving device 16 along the X-axis direction. After the relevant alignment, the picture of the chosen semiconductor chip 2 is taken by the wafer camera 14. The relevant taken picture is recognized by the mounting control device 70 to calculate the positional shift amount between the proper position where the semiconductor chip 2 should be located and the position where the semiconductor chip 2 is actually located, corresponding to the wafer 1. This positional shift amount data is temporarily stored in a memory and the like in the mounting control device 70. After the picture is taken, another semiconductor chip 2 is chosen in order (alternative two semiconductor chips 2, for example) and similar operations are repeated to calculate the respective positional shift amounts.

Figure 10:
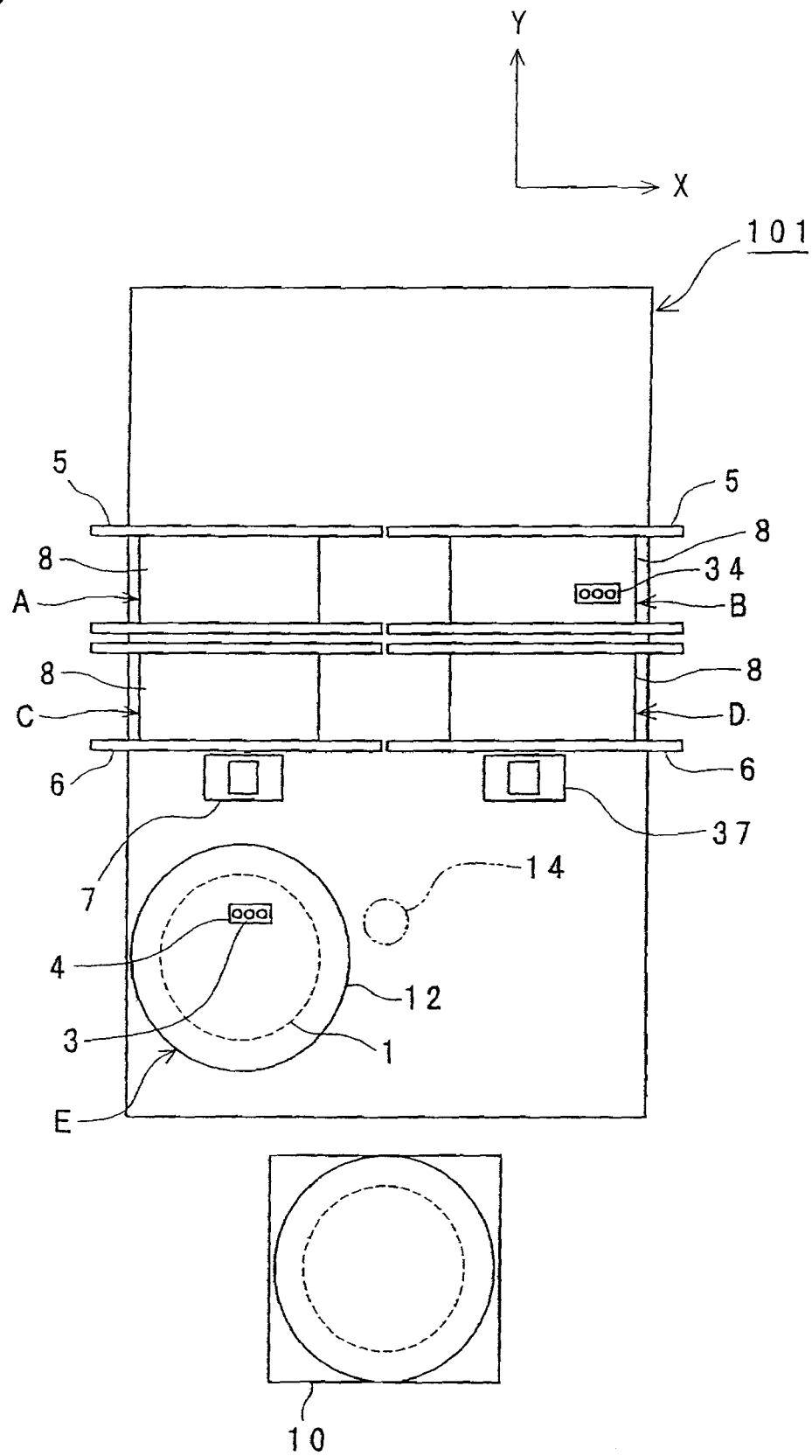
FIG. 10 is a schematic plan view which illustrates the process of the component mounting operation in the component mounting apparatus showing a condition in which the holding table is located at a first component feeding position.

The pictures of the respective semiconductor chips 2 are taken by the wafer camera 14 and the holding table 12 is then moved to the left in the X-axis direction in the figure to be located at the first component feeding position E by the table moving device 16 as shown in FIG. 10. At this time, in a condition in which the sheet contact surface 42 of the push-up pin holding section 41 is in contact with the wafer sheet 50, the whole push-up device 40 is moved to the first component feeding position E integrally with the holding table 12 by the push-up device moving device 20. After that, the push-up pin 45 of the push-up device 40 is moved by the push-up device moving device 20 to be located below the firstly chosen semiconductor chip 2 so as to conduct the alignment of the semiconductor chip 2 with the push-up pin 45. It is to be noted that this alignment, as its timing, instead of such a case, may be conducted when the holding table 12 is located at the wafer recognition position G or while the holding table 12 is moving from the wafer recognition position G to the first component feeding position E as shown in FIG. 9. Since this holding table 12 is moved in a condition in which the sheet contact surface 42 is constantly in contact with the bottom surface of the wafer sheet 50, the shake and vibration of the wafer sheet 50 caused by the movement of the holding table 12 can be reduced and the generation of the arrangement deviation and the like of each semiconductor chip 2 can be preliminarily prevented.

Together with this movement, the first head section 4 is moved upward above the holding table 12 located at the first component feeding position E by the first XY robot (not shown). The alignment of one suction nozzle 3 provided for the first head section 4 with the firstly chosen semiconductor chip 2 is then conducted by the first XY robot. Also at the time of this alignment, the positional shift amount data stored in the memory and the like in the mounting control device 70 is read so as to conduct the alignment in which the positional shift amount is corrected in consideration for the relevant data.

After that, as shown in FIG. 6, the wafer sheet 50 is sucked by each suction hole 43 so that the wafer sheet 50 is held onto the sheet contact surface 42 by suction. In a condition in which the relevant holding by suction is conducted, the push-up pin 45 is moved up from the storing position J to the push-up position K by the push-up pin elevator 44 so as to push up the semiconductor chip 2. As a result, the semiconductor chip 2 is peeled from the top surface of the wafer sheet 50.

Together with this peeling operation, the aligned suction nozzle 3 in the first head section 4 starts to move down so that the lower end of the suction nozzle 3 is in contact with the peeled top surface of the semiconductor chip 2. Together with the contact, the semiconductor chip 2 is sucked and held by the suction nozzle 3 and the semiconductor chip 2 is then taken out from the wafer 1 by moving up the suction nozzle 3.

Once the first semiconductor chip 2 has been taken out, the alignment of the second semiconductor chip 2 with the push-up pin 45 and the alignment of the second semiconductor chip 2 with an alternative suction nozzle 3 are conducted in a similar process. Furthermore, the alignment of the third semiconductor chip 2 with the push-up pin 45 and the alignment of the third semiconductor chip 2 with an alternative suction nozzle 3 are conducted in the similar process. As a result, the semiconductor chip 2 is sucked and held by each of the three suction nozzles 3 provided for the first head section 4.

Figure 11:
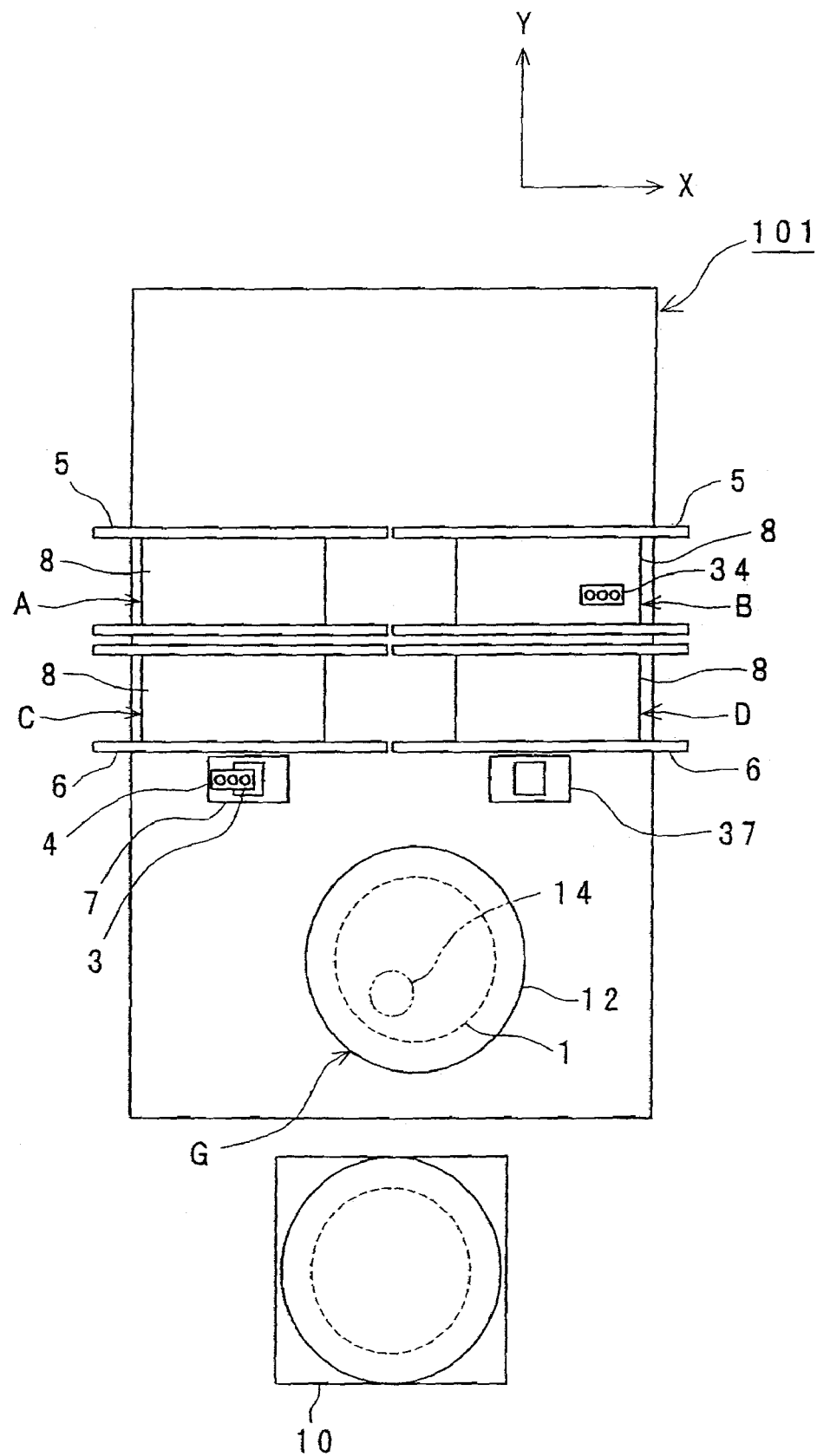
FIG. 11 is a schematic plan view which illustrates the process of the component mounting operation in the component mounting apparatus showing a condition in which the holding table is located at a wafer recognition position.

After that, as shown in FIG. 11, the first head section 4, which holds each of the semiconductor chips 2 by suction, starts moving to the first board holding position A, and each of the suction nozzles 3 passes above the first component recognition camera 7 in the process of the relevant movement. During the relevant passage, the first component recognition camera 7 takes a picture of the sucking and holding attitude of each of the semiconductor chip 2. The taken image data is inputted into the mounting control device 70 to recognition-process the picture of each holding attitude.

On the other hand, the holding table 12, from which each semiconductor chip 2 is taken out, is moved to the right in the X-axis direction in the figure by the table moving device 16 to be located at the wafer recognition position G as shown in FIG. 11. It is to be noted that during this movement, the push-up device 40 is moved by the push-up device moving device 20 integrally with the holding table 12 in a condition in which the sheet contact surface 42 of the push-up pin holding section 41 with the push-up pin 45 located at the storing position J is constantly in contact with the bottom surface of the wafer sheet 50.

After the movement, for example, the semiconductor chip 2 to be mounted on the circuit board 8 which is held at the second board holding position B is chosen from the wafer 1, and the alignment of this chosen semiconductor chip 2 with the wafer camera 14 is conducted. The picture of the relevant semiconductor chip 2 is then taken by the wafer camera 14 so as to calculate the positional shift amount in the mounting control device 70 based on the taken picture. After the picture has been taken, the positional shift amount of each semiconductor chip 2 is calculated by choosing each alternative semiconductor chip 2 further in order, so as to repeat the similar operation.

Figure 12:
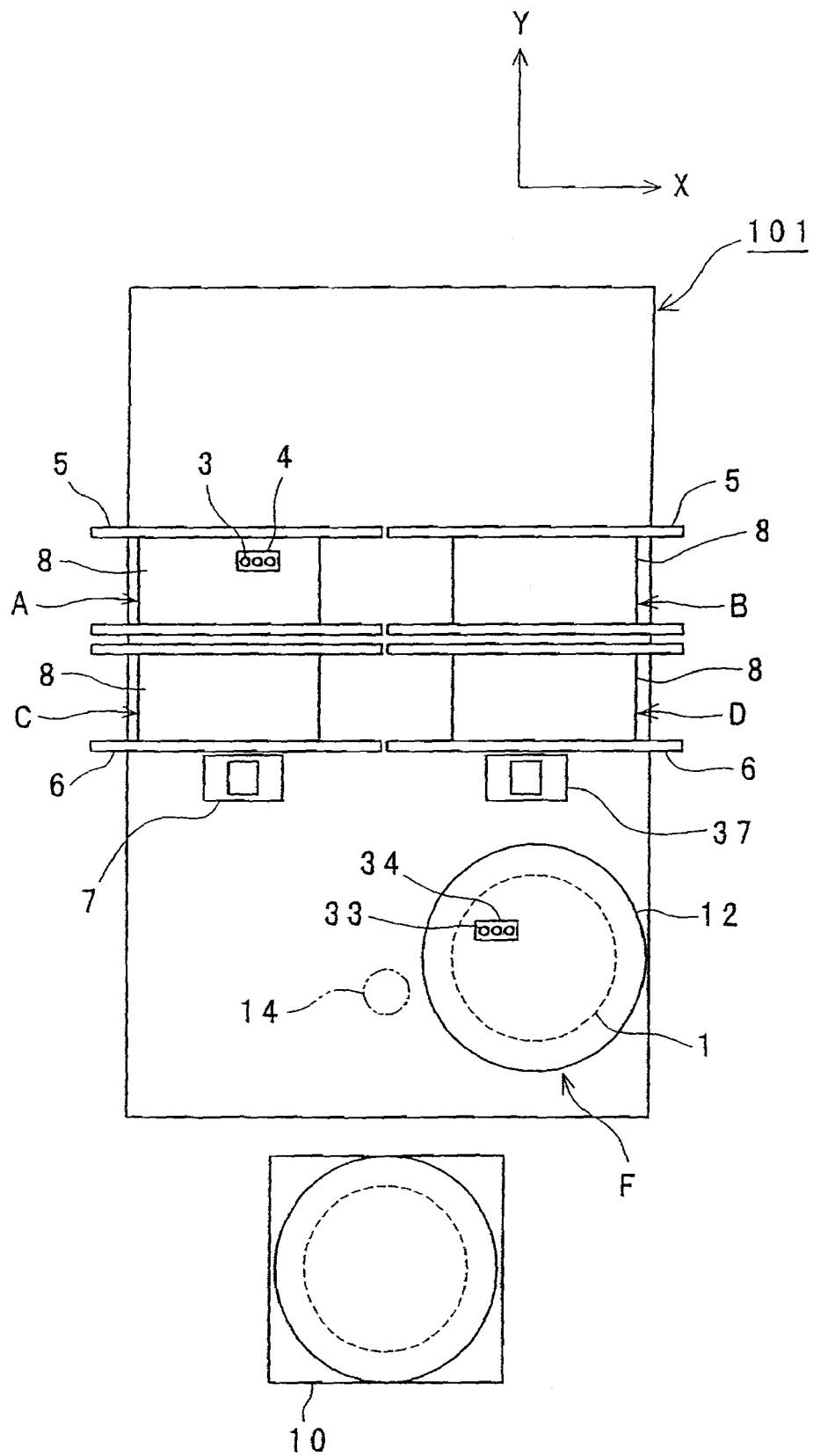
FIG. 12 is a schematic plan view which illustrates the process of the component mounting operation in the component mounting apparatus showing a condition in which the holding table is located at a second component feeding position.

After the passage of the first head section 4 above the first component recognition camera 7, as shown in FIG. 12, the first head section 4 is moved upward above the circuit board 8 held at the first board holding position A so that the mounting operations of the respective semiconductor chips 2 on the circuit board 8, which are sucked and held by each suction nozzle 3, are started in order. It is to be noted that this mounting operation is conducted in consideration of the recognition processing result of the sucking and holding attitude conducted in the mounting control device 70.

Once the picture of each semiconductor chip 2 has been taken by the wafer camera 14, the holding table 12 is moved to the right in the X-axis direction in the figure by the table moving device 16 to be located at the second component feeding position F as shown in FIG. 12. It is to be noted that at this time, the whole push-up device 40 is moved to the second component feeding position F integrally with the holding table 12 by the push-up device moving device 20 in a condition in which the sheet contact surface 42 of the push-up pin holding section 41 is in contact with the wafer sheet 50. After that, the push-up pin 45 of the push-up device 40 is moved to be located below the firstly chosen semiconductor chip 2 by the push-up device moving device 20 so as to conduct the alignment of the semiconductor chip 2 with the push-up pin 45.

Together with this movement, the second head section 34 is moved upward above the holding table 12 located at the second component feeding position F by the second XY robot (not shown). The alignment of one suction nozzle 33 provided for the second head section 34 with the firstly chosen semiconductor chip 2 is then conducted by the second XY robot. Also at the time of this alignment, the positional shift amount data stored in the memory and the like in the mounting control device 70 is read so as to conduct the alignment in which the positional shift amount is corrected in consideration for the relevant data.

After that, as shown in FIG. 6, the wafer sheet 50 is sucked by the suction holes 43 so that the wafer sheet 50 is held onto the sheet contact surface 42 by suction. In a condition in which the relevant holding by suction is conducted, the push-up pin 45 is moved up from the storing position J to the push-up position K by the push-up pin elevator 44 so as to push up the semiconductor chip 2. As a result, the semiconductor chip 2 is peeled from the top surface of the wafer sheet 50.

Together with this peeling operation, the aligned suction nozzle 33 in the second head section 34 starts to move down so that the lower end of the suction nozzle 33 is in contact with the peeled top surface of the semiconductor chip 2. Together with the relevant contact, the semiconductor chip 2 is sucked and held by the suction nozzle 33, and the semiconductor chip 2 is then taken out from the wafer 1 by moving up the suction nozzle 33. Similarly, the second and the third semiconductor chips 2 are sucked and held in a similar process in order. As a result, the semiconductor chip 2 is sucked and held in each of the three suction nozzles 33 provided for the second head section 34.

Figure 13:
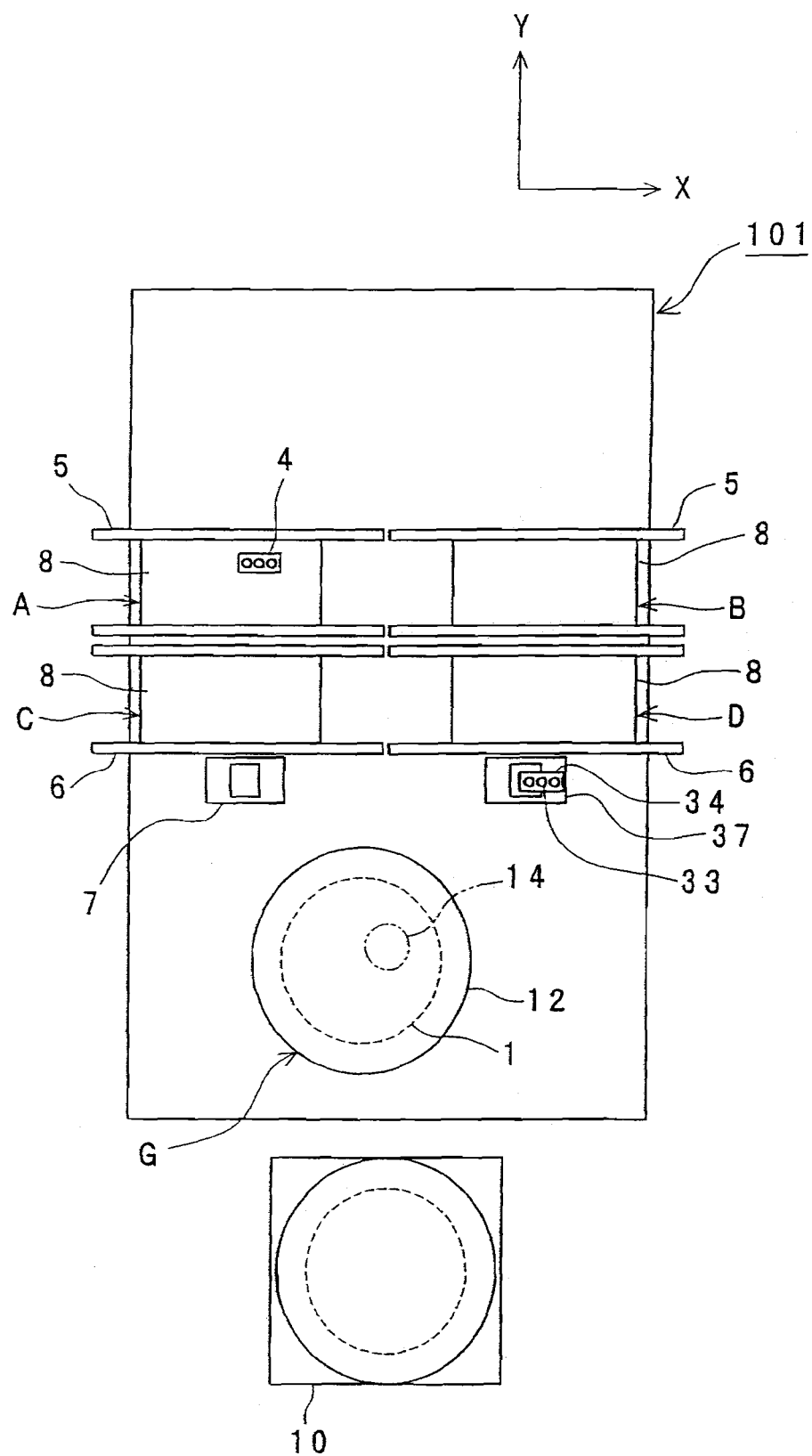
FIG. 13 is a schematic plan view which illustrates the process of the component mounting operation in the component mounting apparatus showing a condition in which a second component recognition camera recognizes a semiconductor chip held by a second head section.

After that, as shown in FIG. 13, the second head section 34 which holds each of the semiconductor chips 2 starts moving to the second board holding position B, and each of the suction nozzles 33 passes above the second component recognition camera 37 in the process of the movement. During the passage, the second component recognition camera 37 takes the picture of the sucking and holding attitude of each of the semiconductor chip 2. The taken image data is inputted into the mounting control device 70 to recognition-process the picture of each holding attitude.

After that, the second head section 34 is moved upward above the circuit board 8 held at the second board holding position B so that the mounting operation of each semiconductor chip 2 on the circuit board 8 is conducted.

It is to be noted that the first head section 4, which has finished the mounting operation, can suck and take out the new semiconductor chip 2 repeatedly by moving the holding table 12 through the wafer recognition position G again to the first board feeding position E after each of the semiconductor chips 2 is sucked and held at the second component feeding position F. In this case, the holding table 12 is preferably moved so as to reach the first board feeding position E to be located there by the time when the first head section 4 which has finished the mount operation returns to the first component feeding position F to be located there. It is because this movement can suppress the loss of each operation of the first head section 4 and the holding table 12 so as to conduct efficient component feeding.

Regarding the mounting operation, although the description is provided for the case in which each semiconductor chip 2 is mounted on the circuit board 8 held at the first board holding position A or the second board holding position B, each semiconductor chip 2 may be mounted on each circuit board 8 held at the third board holding position C and the fourth board holding position D in the similar process.

Also in this embodiment, although the description is provided for the case in which each semiconductor chip 2 is directly taken out of the wafer 1 by sucking and holding by the suction nozzle 3 or the suction nozzle 33, this invention is not limited to such a case. Instead of this case, for example, the invention is also applicable in which there is provided an inversion device to take out each semiconductor chip 2 thereby, and which each semiconductor chip 2 is then delivered to and received by the suction nozzle 3 or the suction nozzle 33 in a condition where the each semiconductor is inverted by the inversion device.

Figure 14:
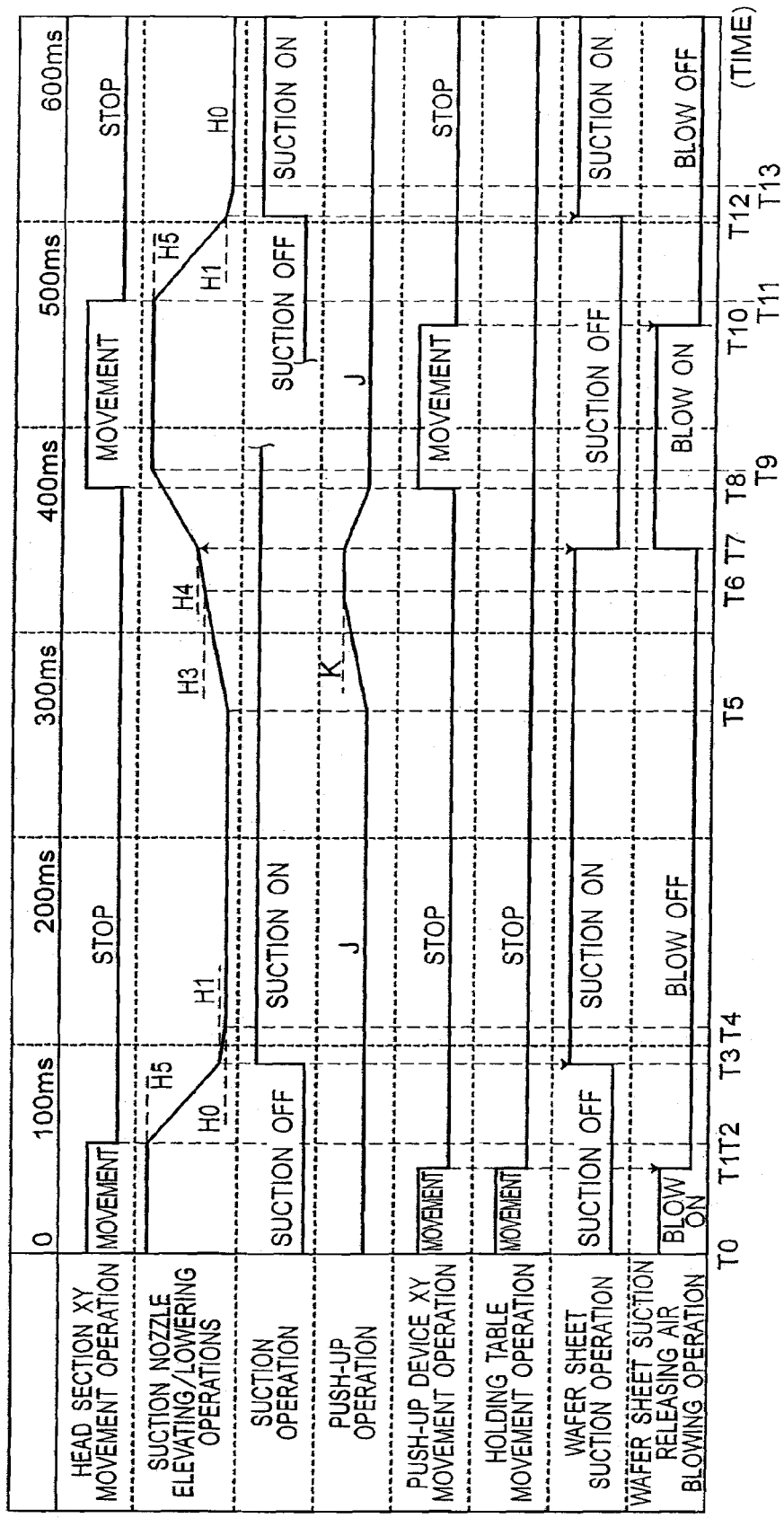
FIG. 14 is a timing diagram of a semiconductor chip in a take-out operation.

Here, the operation of taking out the semiconductor chip 2 from the wafer 1 in the mounting operation of the semiconductor chip 2 on the circuit board 8 will be described in further detail with reference to the timing diagram shown in FIG. 14. This timing diagram shows, for example, the operation timing of the first head section 4 and the component feeding device 11 for taking out one semiconductor chip 2 by sucking and holding after the holding table 12 is located at the first component feeding position E, and for starting to take out one alternative semiconductor chip 2 further after that. It is to be noted that this timing diagram is based on one embodiment and that this invention is not limited to the operation shown in the relevant timing diagram. The timing diagram shown in FIG. 14 shows each operation content of the respective operations along the vertical axis, from the top in order, the movement operation of the first head section 4 by the first XY robot in the X-axis direction or in the Y-axis direction (XY movement operation), the elevating/lowering operation of each suction nozzle 3 provided for the first head section 4 (shown as elevating/lowering height position), the suction operation by the suction nozzle 3 (suction ON or suction OFF), the elevating/lowering operations of the push-up pin 45 by the push-up pin elevator 44 (shown as elevating/lowering height position), the XY movement operation of the push-up device 40 by the push-up device moving device 20, the movement operation of the holding table 12 by the table moving device 16 in the X-axis direction, the suction operation of wafer sheet 50 by the suction holes 43 of the push-up pin holding section 41 (suction ON or suction OFF), and the suction releasing air blowing operation of the wafer sheet 50 by blowing compressed air from the suction holes 43 (blow ON or blow OFF). The horizontal axis, which is set as the timeline, shows the elapsed time between 0 and 600 ms, and the specific time point of the respective operations from Time T0 to Time T13, setting Time 0 ms to T0.

As shown in FIG. 14, at Time T0, the first head section 4 moves in the X-axis direction or in the Y-axis direction toward the first component feeding position E, the holding table 12 is moved by the table moving device 16 toward the first component feeding position E along the X-axis direction, and the push-up device 40 is moved by the push-up device moving device 20 toward first component feeding position E in the X-axis direction or in the Y-axis direction. Also in this condition, each suction nozzle 3 provided for the first head section 4, in which the semiconductor chip 2 is not held by suction in a condition of suction-OFF, is located at upper end height position H5 of elevating/lowering height position. The push-up pin 45 is located at the storing position J in a condition of blow-ON in which compressed air is blown from each suction hold 43. This blow-ON condition allows a thin atmospheric layer to be formed between the sheet contact surface 42 of the push-up pin holding section 41 and the bottom surface of the wafer sheet 50, and even when the push-up pin holding section 41 moves in the X-axis direction or in the Y-axis direction relatively to the wafer sheet 50, smooth movement can be conducted without damaging the surface of the wafer sheet 50. It is to be noted that in this condition, although the sheet contact surface 42 and the wafer sheet 50 are not directly in contact with each other, it can be said that the sheet contact surface 42 and the wafer sheet 50 are in contact with each other through the thin atmospheric layer.

After that, at Time T1, the holding table 12 is located at the first component feeding position E as well as the push-up pin holding section 41 is located below the semiconductor chip 2 to be taken out firstly, and the blowing operation by each suction hole 43 is blow-OFF. After that, at Time T2, the suction nozzle 3 which firstly takes out the semiconductor chip 2 in the first head section 4 is located above the semiconductor chip 2 as well as the lowering operation of the suction nozzle 3 is started.

When the suction nozzle 3 which starts moving down at Time T3 reaches as high as Height H1, as its lowering speed is slowed down and the suction nozzle 3 is slightly moved down further, suction pressure starts to be applied to the tip part below the suction nozzle 3. Also, the bottom surface of the wafer sheet 50 is sucked and held by the suction holes 43 of the push-up pin holding section 41. After that, at Time T4, the tip part of the suction nozzle 3, which has slightly moved down at low speed, is located at lower end Height H0 of elevating/lowering operations, being in contact with the top surface of the semiconductor chip 2 as well as the semiconductor chip 2 is sucked and held by the suction nozzle 3 by the suction pressure. After that, until Time T5, that is, during a prescribed time period between Time T4 and Time T5, this condition is kept so that the suction nozzle 3 holds the semiconductor chip 2 by suction more securely.

When the current time reaches Time T5, the suction nozzle 3, which holds the semiconductor chip 2 by suction, starts moving up gradually as well as the push-up pin 45 starts moving up from the storing position J toward the push-up position K. These elevating operation of the suction nozzle 3 and elevating operation of the push-up pin 45 are conducted so that both operations are synchronized with each other, that is, the respective elevating speeds are equal to each other. This synchronized elevating operations peel the semiconductor chip 2, which is stuck onto the top surface of the wafer sheet 50, from the wafer sheet 50. After that, at Time T6, the push-up pin 45 is located at the push-up position K, the push-up pin 45 then stops moving up, and on the other hand, when the tip part of the suction nozzle 3 is located as high as Height H3, the tip part of the suction nozzle 3 moves up as high as Height H4. As a result, at Time T7 the semiconductor chip 2 is taken out from the wafer sheet 50 by being sucked and held by the suction nozzle 3. Also therewith, at Time T7, the holding by suction of the wafer sheet 50 by the suction holes 43 is released, and suction releasing blowing is conducted.

After that, the suction nozzle 3 moves up as high as Height H5, and the push-up pin 45 moves down toward the storing position J. At Time T8, when the push-up pin 45 is located at the storing position J, the push-up device 40 is moved in the X-axis direction or in the Y-axis direction by the push-up device moving device 20 and the alignment of the push-up pin holding section 41 with the semiconductor chip 2 to be taken out next is conducted. Also, the first head section 4 moves in the X-axis direction or in the Y-axis direction, and the alignment of the suction nozzle 3 to take out the semiconductor chip 2 next with the semiconductor chip 2 is conducted. At Time T10, when the alignment of the push-up pin holding section 41 with the semiconductor chip 2 finishes, the blowing to the wafer sheet 50 is stopped, and further at Time T11, when the alignment of the suction nozzle 3 with the semiconductor chip 2 finishes, the suction nozzle 3 moves down from Height H5. After that, the operation similar to the operation in the case of the first suction nozzle 3 is conducted at Time T12 and Time T13 to take out the semiconductor chip 2 by suction.

In the abovementioned mounting method, since after the position of each semiconductor chip 2 on the wafer 1 is continuously recognized at the wafer recognition position G, the holding table 12 is moved to the component feeding position, the semiconductor chip 2 is held and taken out by suction by the suction nozzle 3 in order based on the recognition, the stretch of the wafer sheet 50 itself is generated by taking out the semiconductor chip 2 from the wafer sheet 50 by peeling so that the stretch generates the arrangement deviation of the semiconductor chip 2 with the result that the shift between the recognition position and the actual position is generated. It is also possible that the mechanical positional shift of the device caused by the difference between the recognition position and the component feeding position is generated.

In order to prevent the generation of the influence on the mounting of the semiconductor chip 2 caused by such a positional shift, the sucking and holding attitude of the semiconductor chip 2 by the suction nozzle 3 is recognized by the component recognition camera to recognize the positional shift amount of the suction nozzle 3 and the semiconductor chip 2 so that the recognition is reflected in the following holding by suction with the result that the respective positional shift amounts can be reduced by correction. The correction operation of such a positional shift amount will hereinafter be described with reference to a schematic view which shows the arrangement relation of each suction nozzle 3 shown in FIG. 15A, FIG. 15B and FIG. 15C and the semiconductor chip 2 held by suction.

Figure 15A:
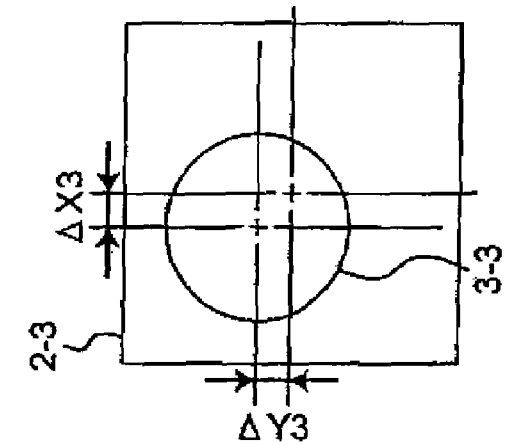
FIG. 15A, FIG. 15B and FIG. 15C are schematic explanatory diagrams showing the sucking and holding attitude of a semiconductor chip by each suction nozzle provided for the head section.
Figure 15B:
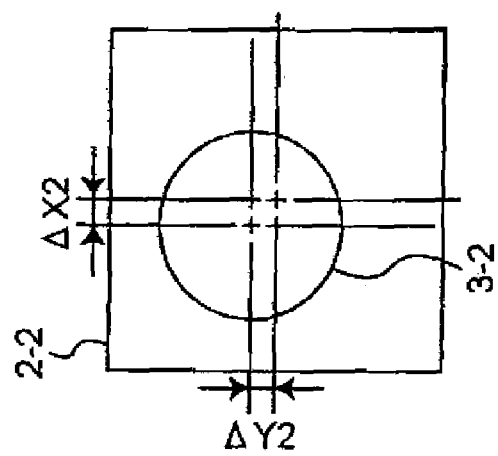
Figure 15C:
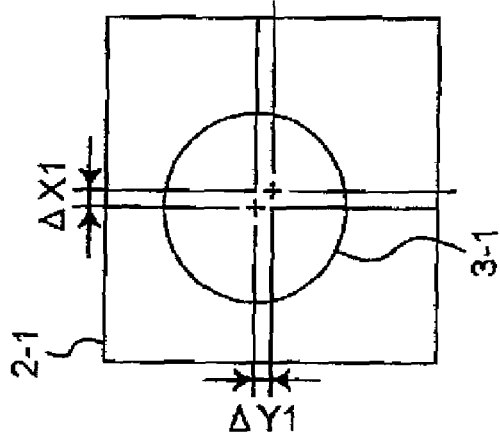

As shown in FIG. 15A to FIG. 15C, for example, setting three suction nozzles 3 provided for the first head section 4 as a suction nozzle 3-1, a suction nozzle 3-2 and a suction nozzle 3-3, respectively, FIG. 15A shows a condition in which the semiconductor chip 2-1 is sucked and held by the suction nozzle 3-1, FIG. 15B shows a condition in which the semiconductor chip 2-2 is sucked and held by the suction nozzle 3-2, and FIG. 15C shows in a condition in which the semiconductor chip 2-3 is sucked and held by the suction nozzle 3-3. It is to be noted that such a condition for sucking and holding (that is, sucking and holding attitude) can be recognized by the mounting control device 70 by being imaged by the first component recognition camera 7, for example.

As shown in FIG. 15A, corresponding to the suction nozzle 3-1 which firstly sucks and holds, the sucked and held semiconductor chip 2-1 is held by suction having a positional shift amount of $\Delta X1$ in the X-axis direction in the figure and a positional shift amount of $\Delta Y1$ in the Y-axis direction in the figure. Also as shown in FIG. 15B, corresponding to the suction nozzle 3-2 which secondly sucks and holds, the semiconductor chip 2-2 is held by suction having a positional shift amount of $\Delta X2$ in the X-axis direction in the figure and a positional shift amount of $\Delta Y2$ in the Y-axis direction in the figure. Furthermore as shown in FIG. 15C, corresponding to the suction nozzle 3-3 which finally sucks and holds, the semiconductor chip 2-3 is held by suction having a positional shift amount of $\Delta X3$ in the X-axis direction in the figure and a positional shift amount of $\Delta Y3$ in the Y-axis direction in the figure.

As for each positional shift amount, for example, relations of $\Delta X1 < \Delta X2 < \Delta X3$ and $\Delta Y1 < \Delta Y2 < \Delta Y3$ are established. This is because it can be thought that the mechanical position shift of the device caused by the difference between the recognition position and the component feeding position corresponds to ($\Delta X1$ and $\Delta Y1$) for example, and that positional shift amount by the stretch of the wafer sheet 50 is added to the mechanical positional shift by being taken out by suction further in order. It is to be noted that the relations of the respective positional shift amounts are not limited to this case.

By storing the respective positional shift amounts in the memory section of the mounting control device 70 and the like, when the first head section 4 sucks and takes out next, the movement position of each suction nozzle 3 is corrected by the positional shift amount per each suction nozzle 3 corresponding to the recognition position of the semiconductor chip 2 by the wafer camera 14.

Specifically, the suction nozzle 3-1 is corrected by taking positional shift amounts ($\Delta X1$ and $\Delta Y1$) as correction amount corresponding to the recognition position by the wafer camera 14. Similarly, the suction nozzle 3-2 is corrected by taking positional shift amounts ($\Delta X2$ and $\Delta Y2$) as correction amount and the suction nozzle 3-3 is correct by taking positional shift amounts ($\Delta X3$ and $\Delta Y3$) as correction amount. These corrections reduce the generation of the mounting defect and the like caused by the positional shift.

It is to be noted that although the above description relates to the case in which the correction is conducted so that the recognition of the positional shift amount in the previous operation of taking out by suction is reflected in the next operation of taking out by suction, the average amount of recognition results of the positional shift amounts in a plurality of operations of taking out by suction may be calculated to correct the positional shift amount using the average amount, instead of such a case.

Also, each semiconductor chip 2 fed from the wafer 1 is often square in shape and about 10 mm in a length and a width, for example. In this case, the suction nozzle 3 can hold and take out by suction securely based on the abovementioned respective recognition operations.

As the size of the semiconductor chip is smaller, however, it becomes possible that the positional shift which is slightly left in the above mentioned recognition method (that is, slightly left positional shift by correction using the estimate amount of positional shift amount) has an influence on the mounting operation. For example, when the semiconductor chip 2 is as small as or smaller than about 3 mm in a length and a width, such a problem clearly occurs.

In order to improve such a problem, as shown in FIG. 1, there is provided a first head camera 91 in the first head section 4 as an example of a head-mounted component recognition device for taking takes the picture of each semiconductor chip 2 on the wafer 1 located at the first component feeding position E so as to recognize the position of the semiconductor chip 2 accurately, and there is provided a second head camera 92 in the second head section 34 as an example of the head-mounted component recognition device for taking the picture of each semiconductor chip 2 on the wafer 1 located at the second component feeding position F so as to recognize the position of the semiconductor chip 2 accurately so that each semiconductor chip 2 is sucked and taken out based on the recognition result by either of the head camera 91 and the head camera 92 with the result that the semiconductor chip 2 can be taken out by suction securely. The process of such suction/take-out operations is shown in the flow diagram of FIG. 16.

Figure 16:
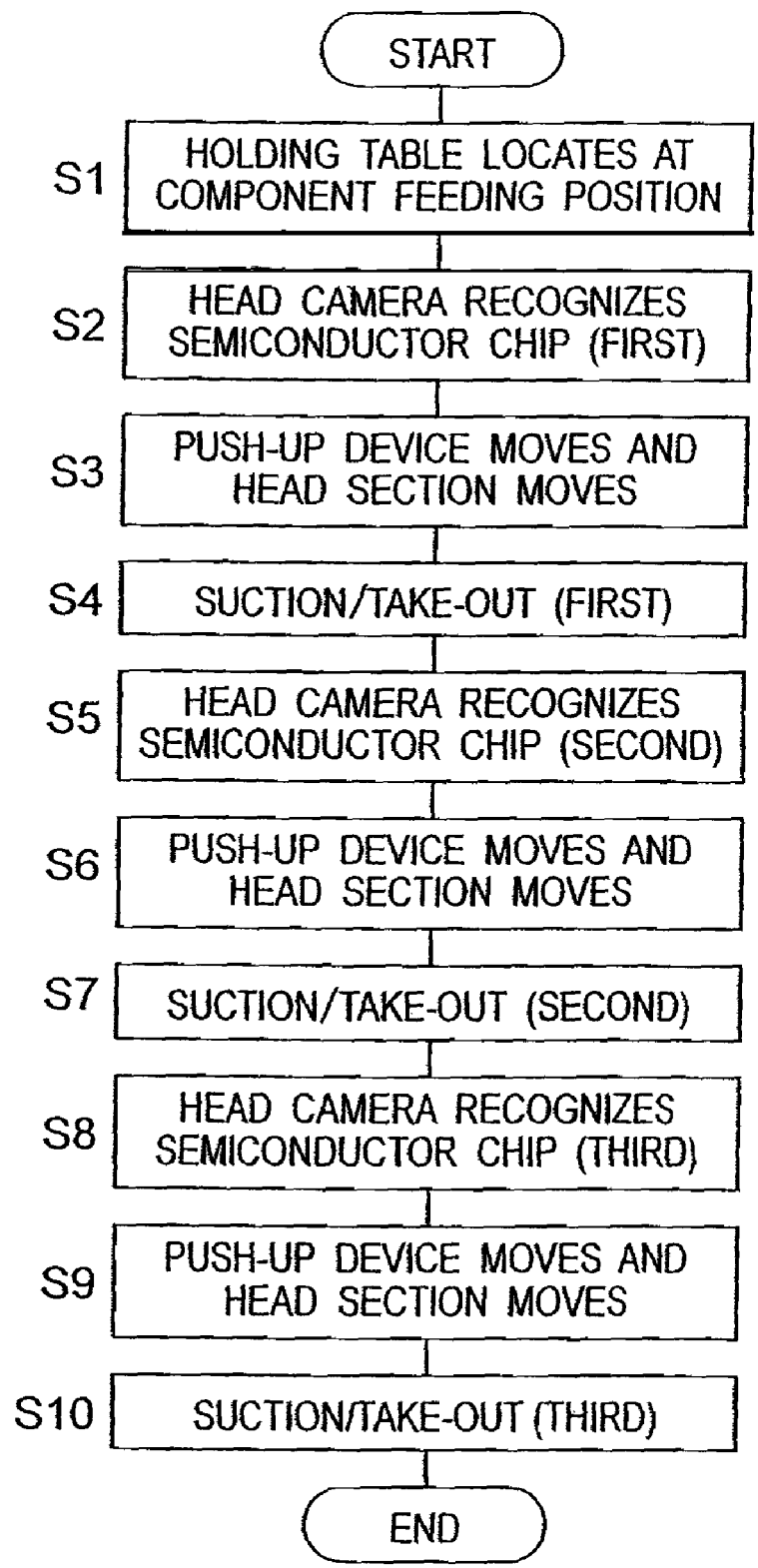
FIG. 16 is a flow diagram showing the process of sucking, holding and taking out using the recognition of a semiconductor chip by a head camera.

As shown in FIG. 16, in Step S1, the holding table 12 is located at the first component feeding position E, for example. Next, in Step S2, the first head section 4 is moved in the X-axis direction or in the Y-axis direction so that the first head camera 91 provided for the first head section 4 is located above the semiconductor chip 2 to be taken out by suction firstly on the wafer 1 (that is, the first semiconductor chip 2) so as to recognize the position of the semiconductor chip 2. After that, in Step S3, the alignment of the push-up device 40 with the semiconductor chip 2 and the alignment of the suction nozzle 3 which firstly sucks and holds in the first head section 4 with the relevant semiconductor chip 2 are conducted based on the recognition result. After this alignment, the semiconductor chip 2 is sucked and taken out in Step S4.

Next, in Step S5, the first head section 4 is moved in the X-axis direction or in the Y-axis direction so that the first head camera 91 provided for the first head section 4 is located above the semiconductor chip 2 to be taken out by suction secondly on the wafer 1 (that is, the second semiconductor chip 2) so as to recognize the position of the semiconductor chip 2. After that, in Step S6, the alignment of the push-up device 40 with semiconductor chip 2 and the alignment of the suction nozzle 3 which secondly sucks and holds in the first head section 4 with the semiconductor chip 2 are conducted based on the recognition result. After this alignment, the semiconductor chip 2 is sucked and taken out in Step S7.

Similarly in Step S8 to Step S10, the semiconductor chip 2 to be taken out by suction thirdly is sucked and taken out.

In such suction/take-out operations, the positional shift caused by the difference between the recognition position of the semiconductor chip 2 and the component feeding position can be securely eliminated. Also, since the position of the semiconductor chip 2 to be taken out by suction is recognized every time each suction nozzle 3 sucks and takes out, the positional shift caused by the stretch of the wafer sheet 50 have no influence on the suction/take-out operations. Consequently, the semiconductor chip 2 of a fine size can be held by suction securely.

According to the above embodiment, the following various effects can be achieved.

Since the component mounting apparatus 101 which has two head sections of the first head section 4 and the second head section 34, is provided with the holding table 12 which holds the wafer 1 so as to move reciprocationally between the first component feeding position E in which the semiconductor chip 2 is fed to the first head section 4, and the second component feeding position F in which the semiconductor chip 2 is fed to the second head section 34, the semiconductor chip 2 can be fed efficiently as well as the device structure is simplified to reduce the device cost.

Also, while the semiconductor chip 2 is held and taken out from the wafer 1 by one head section by moving reciprocationally the holding table 12 between the first component feeding position E and the second component feeding position F so as to feed each semiconductor chip 2 to the first head section 4 and the second head section 34 alternately, each sucked and held semiconductor chip 2 can be mounted on the circuit board 8 by the other head section. That is, the time required for taking out the semiconductor chip 2 by suction by one head section and the time required for mounting a semiconductor chip by the other head section can be overlapped each other. Consequently, the above device structure is simplified as well as component mounting can be conducted efficiently.

Since the sheet contact surface 42 of the push-up pin holding section 41 is constantly in contact with the wafer sheet 50 when the holding table 12 moves as described above, the shake and vibration of the wafer sheet 50 which may be caused by the movement can be preliminarily prevented or reduced. As a result, the reciprocational movement of the holding table 12 can be achieved.

Since when the holding table 12 is moved by the table moving device 16, the push-up device 40 is moved integrally with the holding table 12 by the push-up device moving device 20 in a condition in which the sheet contact surface 42 is constantly in contact with the wafer sheet 50, the push-up operation of the semiconductor chip 2 can be conducted, by moving up the push-up pin 45 from the storing position J to the push up position K immediately after the holding table 12 is located at either the first component feeding position E or the second component feeding position F. Consequently, even when such a movement is conducted, push-up operation can be immediately started so that the time required for taking out the semiconductor chip 2 is reduced, with the result that productive component mounting can be achieved.

Since the push-up device moving device 20 is provided dependently from the table moving device 16 which is the moving device of the holding table 12, for allowing for the alignment of the push-up pin 45 with one semiconductor wafer 2 by moving the push-up device 40 in the X-axis direction or in the Y-axis direction in a condition in which the push-up pin 45 is located at the storing position J and which the sheet contact surface 42 is in contact with the wafer sheet 50, the alignment of the push-up pin 45 with one semiconductor wafer 2 can be conducted by moving the push-up device 40 freely even in the middle of the movement of the holding table 12. Therefore, also in this regard, it can be said that the time required for push-up operation, that is, the time required for taking out the semiconductor chip 2 can be reduced, and that productive component mounting can be achieved.

Since there is also provided the wafer recognition position G roughly at the midpoint between the first component feeding position E and the second component feeding position F for detecting the positional shift amount between the proper position where the semiconductor chip 2 should be located and the position where the semiconductor chip 2 is actually located corresponding to the wafer 1, and one wafer camera 14 is provided above this wafer recognition position G for taking the picture of the semiconductor chip 2, in the middle of the reciprocational movement between the first component feeding position E and the second component feeding position F, the positional shift amount of the respective fed semiconductor chips 2 can be detected by the one wafer camera 14. Consequently, the detection of the positional shift amount can be conducted efficiently by the one wafer camera 14 with the result that the productivity of the component mounting apparatus is further improved.

Since the table moving device 16 for moving the holding table 12 reciprocationally has one-shaft structure only for the X-axis direction and the moving device for moving the wafer camera 14 has one-shaft structure only for the Y-axis direction, the camera 14 can take the picture of the semiconductor chip 2 securely as well as the controllability of each movement can be improved (as compared to two-shaft structure, for example).

By properly combining the arbitrary embodiments of the aforementioned various embodiments, the effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2003-302782 filed on Aug. 27, 2003 including specification, drawing and claims are incorporated herein by reference in its entirety.

The invention claimed is:

1. A component mounting apparatus for mounting a plurality of components of semiconductor chips fed from a diced wafer on a board, comprising:
   a board holding device for holding the board fed to the component mounting apparatus releasably at a board holding position;
   a first mounting head for holding and taking out the component fed from a first component feeding position and mounting the component on the board held at the board holding position;
   a second mounting head for holding and taking out the component fed from a second component feeding position and mounting the component on the board held at the board holding position; and
   a component feeding device which is provided with a wafer holding table for holding the wafer and a table moving device for moving the wafer holding table reciprocally between the first component feeding position and the second component feeding position, so as to feed the component from the wafer to each moving head at each component feeding position,
   wherein the board holding device has a first board holding position where the board on which the component is mounted by the first mounting head is held, and a second board holding position where the board on which the component is mounted by the second mounting head is held, as the board holding positions, further comprising:
   a first head moving device for moving the first mounting head roughly along a surface of the board independently so as to move between the first board holding position and the first component feeding position; and
   a second head moving device for moving the second mounting head roughly along the surface of the second board independently so as to move between the second board holding position and the second component feeding position.

2. The component mounting apparatus as defined in claim 1, wherein
   in the component feeding device,
   the wafer holding table has a holding portion for holding a wafer sheet which sticks the respective components onto a top surface of the wafer sheet;
   a push-up device is further provided for pushing up one component of the respective components to peel the one component from the wafer sheet so that the one component is fed; and
   the push-up device is moved reciprocally between the first component feeding position and the second component feeding position, together with the wafer holding table.

3. The component mounting apparatus as defined in claim 2, wherein
   the push-up device comprising:
   a push-up pin for pushing up the component from below of the wafer sheet;
   a push-up pin holding section for holding the push-up pin liftably which has a sheet contact portion in contact with a bottom surface of the wafer sheet; and
   a push-up pin elevator for lifting up and down the push-up pin between a storing position where a push-up tip of the push-up pin is stored inside the sheet contact portion and a push-up position where the component is pushed up through the wafer sheet, located in an upper position than the sheet contact portion, wherein
   the push-up device is moved with the wafer holding table, bringing the sheet contact portion into contact with the wafer sheet in a condition in which the push-up pin is located at the storing position by the push-up pin elevator.

4. The component mounting apparatus as defined in claim 3, wherein
   the push-up device is provided with a push-up pin relative movement device for moving the push-up pin holding section and the wafer sheet relatively to each other along the surface of the wafer sheet, and
   an alignment of the one component with the push-up pin is conducted by the relative movement of the push-up pin relative movement device in a condition in which the sheet contact portion of the push-up pin holding section is in contact with the wafer sheet.

5. The component mounting apparatus as defined in claim 1, further comprising a component recognition device for recognizing positions of the respective fed components on the wafer holding table corresponding the wafer holding table located at a component recognition position which is located between the first component feeding position and the second component feeding position.

6. The component mounting apparatus as defined in claim 5, wherein
   the first mounting head is provided with a plurality of component holding members for holding the component releasably; and
   a control device is provided for controlling the component feeding device to move the wafer holding table to the component recognition position, controlling the component recognition device to recognize positions of the respective components which are held and taken out by the respective component holding members of the first mounting head at the component recognition position, controlling the component feeding device to move the wafer holding table to the first component feeding position, and controlling the first head moving device to hold and take out the respective components based on recognition results of the respective positions at the first component feeding position by the component holding members in order.

7. The component mounting apparatus as defined in claim 1, wherein the first mounting head and the second mounting head are further provided with a head-mounted component recognition device for recognizing the positions of the respective fed components on the wafer holding table corresponding to the wafer holding table which is located at either the first component feeding position or the second component feeding position.

8. The component mounting apparatus as defined in claim 1, wherein a control device is provided, for controlling the first head moving device and the first mounting head to hold and take out the component by the first mounting head at the first component feeding position, to move the first mounting head to the board holding position with the held component, to mount the held component on the board, and to return the first mounting head to the first component feeding position, and for controlling the component feeding device, the second head moving device and the second mounting head to move the wafer holding table from the first component feeding position to the second component feeding position, to hold and take out the component by the second mounting head at the second component feeding position, and to return the wafer holding table to the first component feeding position to be located there, until arriving of the first mounting head at the first component feeding position.

* * * * *

UNITED STATES PATENT AND TRADEMARK OFFICE
CERTIFICATE OF CORRECTION

PATENT NO. : 8,001,678 B2
APPLICATION NO. : 12/202594
DATED : August 23, 2011
INVENTOR(S) : Akira Kabeshita et al.

Page 1 of 1

It is certified that error appears in the above-identified patent and that said Letters Patent is hereby corrected as shown below:

On the Cover Page
In Section (62), "Related U.S. Application Data" should read as follows:

--Division of application No. 10/564,275, filed Jan. 11, 2006, now Pat. No. 7,437,818, which is a National Stage of International Application No. PCT/JP2004/012600, filed August 25, 2004.--

Signed and Sealed this
Tenth Day of January, 2012

David J. Kappos
*Director of the United States Patent and Trademark Office*